(12) United States Patent
Yang et al.

(10) Patent No.: US 11,437,457 B2
(45) Date of Patent: Sep. 6, 2022

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Shuangbin Yang, Beijing (CN); Bo Cheng, Beijing (CN); Yulong Wei, Beijing (CN); Xiangdan Dong, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/255,686

(22) PCT Filed: Nov. 29, 2019

(86) PCT No.: PCT/CN2019/122184
§ 371 (c)(1),
(2) Date: Dec. 23, 2020

(87) PCT Pub. No.: WO2021/102999
PCT Pub. Date: Jun. 3, 2021

(65) Prior Publication Data
US 2021/0367021 A1    Nov. 25, 2021

(51) Int. Cl.
*G09G 3/3233* (2016.01)
*H01L 27/32* (2006.01)

(52) U.S. Cl.
CPC ....... *H01L 27/3265* (2013.01); *G09G 3/3233* (2013.01); *H01L 27/3276* (2013.01);
(Continued)

(58) Field of Classification Search
CPC ......... G09G 3/3233; G09G 2300/0426; G09G 2300/043; G09G 2300/0819;
(Continued)

(56) References Cited

U.S. PATENT DOCUMENTS 10,566,402 B2    2/2020  Cho et al.
2001/0055828 A1  12/2001 Kaneko et al.
(Continued)

FOREIGN PATENT DOCUMENTS

CN    105720071 A    6/2016
CN    106469745 A    3/2017
(Continued)

*Primary Examiner* — Stacy Khoo
(74) *Attorney, Agent, or Firm* — Dilworth & Barrese, LLP.; Michael J. Musella, Esq.

(57) ABSTRACT

A display substrate and a display device are provided. The display substrate includes a base substrate and a plurality of sub-pixels on the base substrate. Each sub-pixel includes a pixel circuit and pixel circuits are in columns in a first direction and rows in a second direction. The sub-pixels includes a first sub-pixel, and the display substrate further includes a first data line extended in the first direction and connected with the first sub-pixel. The sub-pixels further includes a second sub-pixel directly adjacent to the first sub-pixel in the second direction. A first capacitor electrode in the first sub-pixel and a first capacitor electrode in the second sub-pixel are in a same layer and are spaced apart from each other; and the first capacitor electrode in the first sub-pixel is overlapped with the first data line in a direction perpendicular to the base substrate to provide a first capacitor.

20 Claims, 10 Drawing Sheets

(52) U.S. Cl.
CPC ............... *G09G 2300/043* (2013.01); *G09G 2300/0426* (2013.01); *G09G 2300/0819* (2013.01); *G09G 2300/0842* (2013.01); *G09G 2320/0223* (2013.01)

(58) Field of Classification Search
CPC .... G09G 2300/0842; G09G 2320/0223; H01L 27/32; H01L 27/3265; H01L 27/3276
See application file for complete search history.

(56) References Cited

U.S. PATENT DOCUMENTS

| | | |
|---|---|---|
| 2016/0155792 A1 | 6/2016 | Wang et al. |
| 2017/0025487 A1 | 1/2017 | Byun et al. |
| 2019/0280076 A1 | 9/2019 | Bang et al. |
| 2019/0355802 A1 | 11/2019 | Shim et al. |
| 2020/0043406 A1* | 2/2020 | Cha .................. G09G 3/325 |
| 2020/0411611 A1 | 12/2020 | Liu et al. |
| 2021/0343226 A1* | 11/2021 | Okabe ................ G09G 3/3266 |

FOREIGN PATENT DOCUMENTS

| | | |
|---|---|---|
| CN | 208335702 U | 1/2019 |
| CN | 109360851 A | 2/2019 |
| CN | 109962096 A | 7/2019 |
| CN | 110246864 A | 9/2019 |
| CN | 110265458 A | 9/2019 |
| CN | 110503918 A | 11/2019 |

* cited by examiner

Ca

DISPLAY SUBSTRATE AND DISPLAY DEVICE

TECHNICAL FIELD

Embodiments of the present disclosure relate to a display substrate and a display device.

BACKGROUND

In the field of Organic Light Emitting Diode (OLED) display, with the rapid development of high-resolution products, higher requirements are put forward on the structural design of a display substrate, such as the arrangement of pixels and signal lines.

SUMMARY

At least one embodiment of the present disclosure provides a display substrate, comprising a base substrate and a plurality of sub-pixels on the base substrate. Each of the plurality of sub-pixels comprises a pixel circuit for driving a light emitting element to emit light; the plurality of pixel circuits of the plurality of sub-pixels are distributed in a plurality of columns in a first direction and a plurality of rows in a second direction; the pixel circuit comprises a drive sub-circuit, a data write sub-circuit, a compensation sub-circuit and a storage sub-circuit; the drive sub-circuit comprises a control terminal, a first terminal and a second terminal, and is configured to be coupled with the light emitting element and control a drive current flowing through the light emitting element; the data write sub-circuit comprises a control terminal, a first terminal and a second terminal, the control terminal of the data write sub-circuit is configured to receive a first scanning signal, the first terminal of the data write sub-circuit is configured to receive a data signal, the second terminal of the data write sub-circuit is electrically connected with the drive sub-circuit, and the data write sub-circuit is configured to write the data signal into the first terminal of the drive sub-circuit in response to the first scanning signal; the compensation sub-circuit comprises a control terminal, a first terminal and a second terminal, the control terminal of the compensation sub-circuit is configured to receive a second scanning signal, the first terminal and the second terminal of the compensation sub-circuit are electrically connected with the control terminal and the second terminal of the drive sub-circuit respectively, and the compensation sub-circuit is configured to perform threshold value compensation on the drive sub-circuit in response to the second scanning signal; the storage sub-circuit is electrically connected with the control terminal of the drive sub-circuit and a first voltage terminal and is configured to store the data signal; the storage sub-circuit comprises a storage capacitor, a first capacitor electrode of the storage capacitor is coupled with the first voltage terminal, and a second capacitor electrode is coupled with the control terminal of the drive sub-circuit; the plurality of sub-pixels comprise a first sub-pixel, the display substrate further comprises a first data line connected with the first sub-pixel, the first data line is extended in the first direction and is connected with the first terminal of the data write sub-circuit of the first sub-pixel to provide the data signal; the plurality of sub-pixels further comprises a second sub-pixel directly adjacent to the first sub-pixel in the second direction; the first capacitor electrode in the first sub-pixel and the first capacitor electrode in the second sub-pixel are in a same layer and are spaced apart from each other; and the first capacitor electrode in the first sub-pixel is overlapped with the first data line in a direction perpendicular to the base substrate to provide a first capacitor.

In some examples, the first capacitor electrode in the first sub-pixel comprises an extension portion, and the extension portion is overlapped with the first data line in the direction perpendicular to the base substrate to provide the first capacitor.

In some examples, the first data line is between the pixel circuit of the first sub-pixel and the pixel circuit of the second sub-pixel.

In some examples, the drive sub-circuit in the second sub-pixel comprises a first transistor, the first transistor comprises a gate electrode, a first electrode and a second electrode, and the second electrode functions as the second terminal of the drive sub-circuit; the second electrode of the first transistor is not overlapped with the first capacitor electrode in the first sub-pixel in the direction perpendicular to the base substrate.

In some examples, a ratio of an area of the extension portion to an area of the first capacitor electrode is in a range of 1/10-1/3.

In some examples, in the first direction, a ratio of a maximum size of the extension portion to a maximum size of the first capacitor electrode is in a range of 1/4-1/2.

In some examples, the first sub-pixel further comprises a second capacitor; a first terminal and a second terminal of the second capacitor are respectively electrically connected with the first data line and the second capacitor electrode of the first sub-pixel.

In some examples, the second capacitor comprises a first sub-capacitor and a second sub-capacitor connected in series with each other; the display substrate further comprises a first scan line extended in the second direction, the first scan line is connected with the control terminal of the compensation sub-circuit to provide the second scanning signal, and the first scan line and the first data line are overlapped with each other in the direction perpendicular to the base substrate to form the first sub-capacitor; the first sub-pixel further comprises a first connection electrode, the first connection electrode is connected with the second capacitor electrode and the second terminal of the compensation sub-circuit respectively, and the first scan line and the first connection electrode are overlapped with each other in the direction perpendicular to the base substrate to form the second sub-capacitor.

In some examples, in the direction perpendicular to the base substrate, the first connection electrode is on a side of the first capacitor electrode away from the second capacitor electrode; the first capacitor electrode comprises a first via hole, and the first connection electrode is electrically connected with the second capacitor electrode through the first via hole.

In some examples, the display substrate further comprises a plurality of first power lines, and the plurality of first power lines are extended in the first direction, are connected to the first voltage terminal, and are configured to provide a first power voltage for the plurality of sub-pixels.

In some examples, the plurality of first power lines are on a side of the first capacitor electrode away from the base substrate, the display substrate further comprises an interlayer insulating layer between the first capacitor electrode and the plurality of first power lines, two of the plurality of first power lines are respectively electrically connected with the first capacitor electrode in the first sub-pixel and the first capacitor electrode in the second sub-pixel through a second via hole in the interlayer insulating layer to provide the first power voltage.

In some examples, the display substrate further comprises a second power line, the second power line is extended in the second direction and is electrically connected with the plurality of first power lines.

In some examples, none of opening regions of the plurality of sub-pixels is overlapped with the second power line in the direction perpendicular to the base substrate.

In some examples, the display substrate further comprises a plurality of third power lines extended in the first direction, the plurality of third power lines are electrically connected with the plurality of first power lines in one-to-one correspondence respectively, and each of the plurality of third power lines is at least partially overlapped with the corresponding first power line in the direction perpendicular to the base substrate.

In some examples, the plurality of third power lines and the plurality of second power lines are in a same layer and are of an integral structure.

In some examples, the plurality of third power lines are on a side of the plurality of first power lines away from the base substrate; the display substrate further comprises a planarization layer between the plurality of third power lines and the plurality of first power lines, each of the plurality of third power line is electrically connected with the corresponding first power line through a third via hole in the planarization layer, so that the second power line is electrically connected with the plurality of first power lines.

In some examples, each of the plurality of sub-pixels further comprises a second connection electrode and a third connection electrode. wherein the second connection electrode and the plurality of first power lines are in a same layer and are insulated from one another, and the third connection electrode and the second power line are in a same layer and are insulated from each other, the second connection electrode and the pixel circuit of each of the plurality of sub-pixels are electrically connected through a fourth via hole, the first connection electrode and the second connection electrode of each plurality of sub-pixels are electrically connected through a fifth via hole, and the third connection electrode is configured to be electrically connected with the light emitting element of each plurality of sub-pixels through a sixth via hole.

In some examples, neither of an orthographic projection of the fifth via hole on the base substrate and an orthographic projection of the sixth via hole on the base substrate is overlapped with an orthographic projection of an opening region of the sub-pixel to which the fifth via hole and the sixth via hole belong on the base substrate.

In some examples, the orthographic projection of the fifth via on the base substrate is closer to the orthographic projection of the opening region of the sub-pixel than the orthographic projection of the sixth via hole on the base substrate.

At least one embodiment of the present disclosure further provides a display device, comprising the above-mentioned display substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the field of Organic Light Emitting Diode (OLED) display, with the rapid development of high-resolution products, higher requirements are put forward on the structural design of a display substrate, such as the arrangement of pixels and signal lines. For example, compared with an OLED display device with a resolution of 4K, due to its doubled sub-pixel units, the OLED display device with a large size and a resolution of 8K has a doubled pixel density. On the one hand, a line width of a signal line is decreased, which leads to an increased self-resistance of the signal line; and on the other hand, overlap of signal lines occurs often, causing an increased parasitic capacitance of the signal line, which all leads to an increased resistance-capacitance load of the signal line. Correspondingly, signal delay (RC delay), voltage drop (IR drop), voltage rise (IR rise), or the like caused by the resistance-capacitance load may become serious. These phenomena may seriously affect display quality of a display product.

Figure 1A:
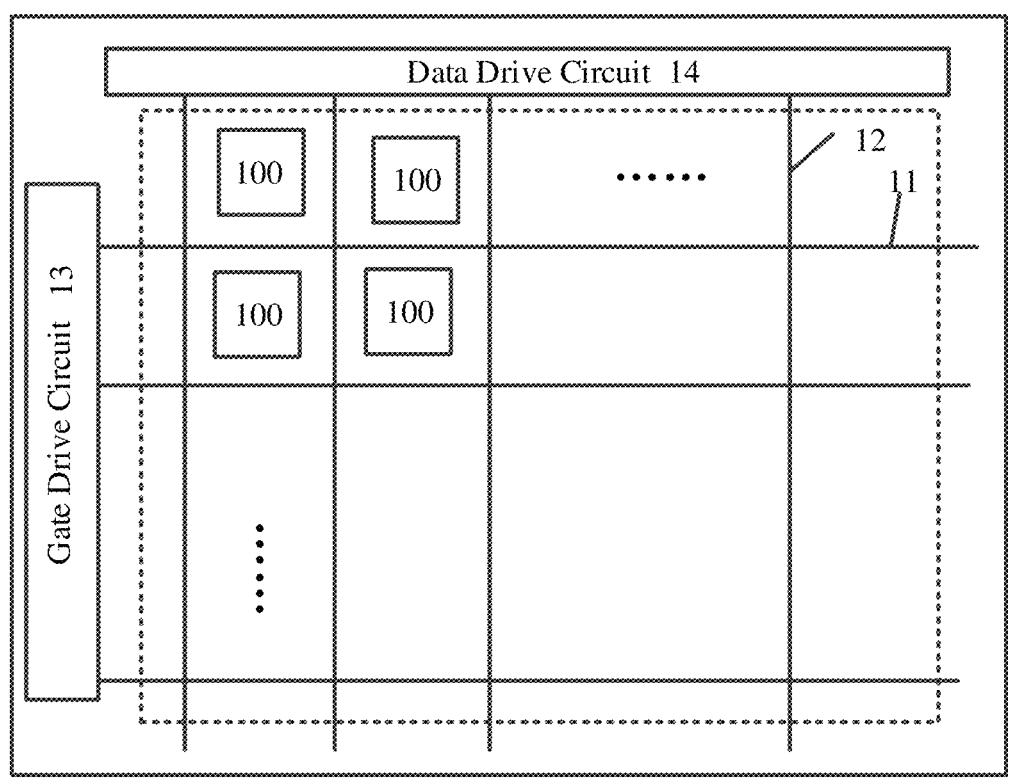
FIG. 1A is a first schematic diagram of a display substrate according to at least one embodiment of the present disclosure.

FIG. 1A is a block diagram of a display substrate according to at least one embodiment of the disclosure. As shown in FIG. 1A, the display substrate 20 includes a plurality of sub-pixels 100, a plurality of gate lines 11, and a plurality of data lines 12 arranged in an array. Each sub-pixel 100 includes a light emitting element and a pixel circuit driving the light emitting element. The plurality of gate lines 11 and the plurality of data lines 12 intersect with one another to define a plurality of pixel regions arranged in an array in the display region, and a pixel circuit of one sub-pixel 100 is disposed in each pixel region. The pixel circuit is, for example, a conventional pixel circuit, such as a 2T1C (i.e., two transistors and one capacitor) pixel circuit, nTmC (n, m are positive integers) pixel circuit, such as 4T2C, 5T1C, 7T1C, etc., and in various embodiments, the pixel circuit may further include a compensation sub-circuit that includes an internal compensation sub-circuit or an external compensation sub-circuit, which may include transistors, capacitors, etc. For example, the pixel circuit may further include a reset circuit, a light emission control sub-circuit, a detection circuit, or the like as necessary. For example, the display substrate may further include a gate drive sub-circuit 13 and a data drive sub-circuit 14 in a non-display region. The gate drive sub-circuit 13 is connected to the pixel circuit through the gate line 11 to provide various scanning signals, and the data drive sub-circuit 14 is connected to the pixel circuit through the data line 12 to provide data signals. The positions of the gate drive sub-circuit 13 and the data drive sub-circuit 14 as well as the gate lines 11 and the data lines 12 in the display substrate shown in FIG. 1A are merely examples, and may be designed as required actually.

For example, the display substrate 20 may further include a control circuit (not shown). For example, the control circuit is configured to control the data drive sub-circuit 14 to apply the data signal, and to control the gate electrode drive sub-circuit to apply the scanning signal. One example of the control circuit is a timing control circuit (T-con). The control circuit may be in various forms, for example including a processor and a memory, the memory including executable codes that the processor may execute to perform the above-mentioned detection method.

For example, the processor may be a Central Processing Unit (CPU) or other form of processing device having data processing capabilities and/or instruction execution capabilities, and may include, for example, a microprocessor, a Programmable Logic Controller (PLC), or the like.

For example, a storage device may include one or more computer program products that may include various forms of computer-readable storage media, such as volatile memory and/or non-volatile memory. The volatile memory may include, for example, a random access memory (RAM), and/or a cache memory (cache), or the like. The non-volatile memory may include, for example, a read only memory (ROM), a hard disk, a flash memory, etc. One or more computer program instructions may be stored on a computer-readable storage medium and the processor may perform the function desired by the program instruction. Various applications and data may also be stored in the computer-readable storage medium.

Figure 1B:
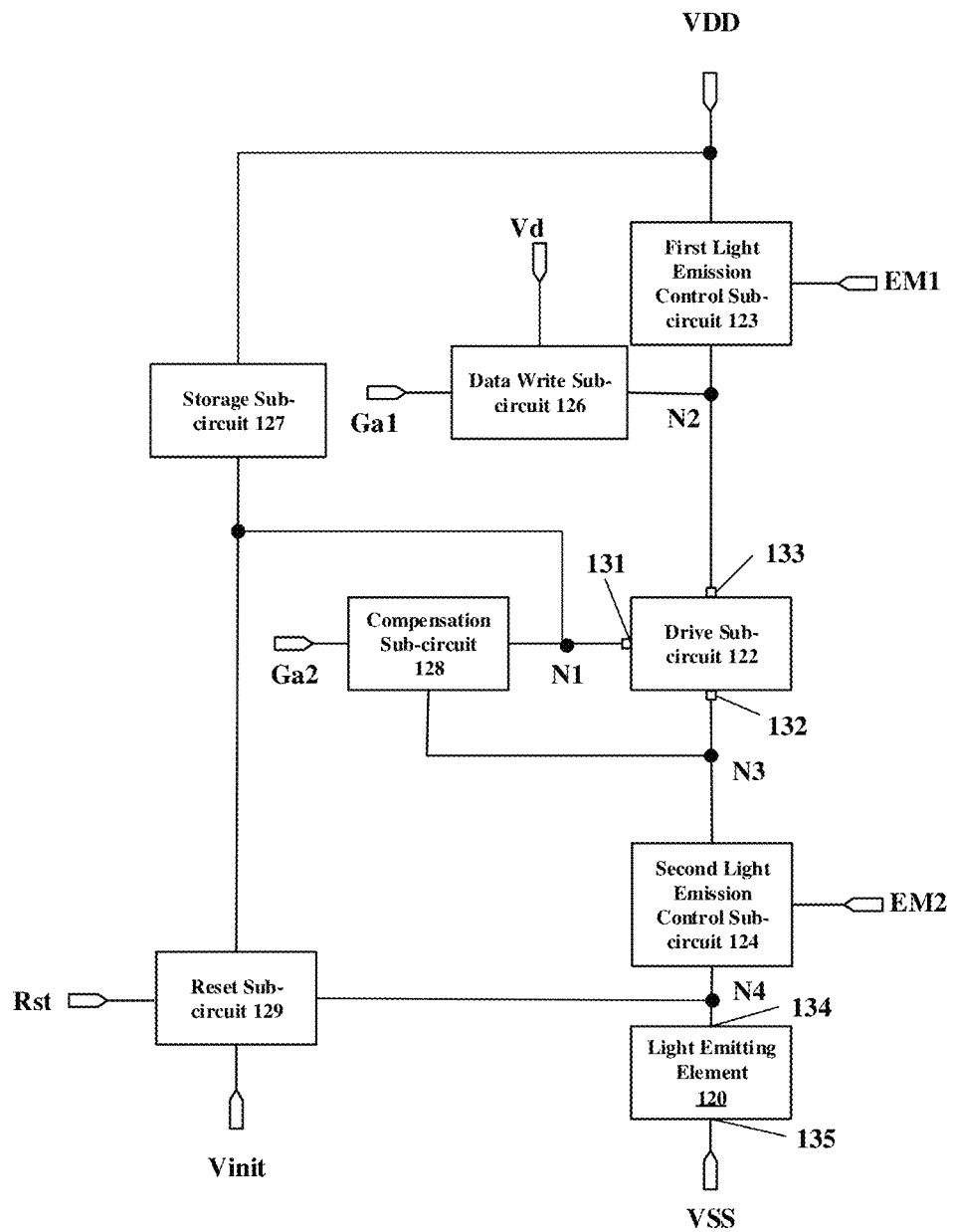
FIG. 1B is a first diagram of a pixel circuit in the display substrate according to at least one embodiment of the present disclosure.

The pixel circuit may include a drive sub-circuit, a data write sub-circuit, a compensation sub-circuit, and a storage sub-circuit, and may further include a light emission control sub-circuit, a reset circuit, or the like, as necessary. FIG. 1B shows a schematic diagram of a pixel circuit.

As shown in FIG. 1B, the pixel circuit includes a drive sub-circuit 122, a data write sub-circuit 126, a compensation sub-circuit 128, a storage sub-circuit 127, a first light emission control sub-circuit 123, a second light emission control sub-circuit 124, and a reset circuit 129.

For example, the drive sub-circuit 122 includes a control terminal 131, a first terminal 132 and a second terminal 133, and the drive sub-circuit 122 is configured to control a drive current flowing through the light emitting element 120, and the control terminal 131 of the drive sub-circuit 122 is connected to a first node N1, the first terminal 132 of the drive sub-circuit 122 is connected to a second node N2, and the second terminal 133 of the drive sub-circuit 122 is connected to a third node N3.

For example, the data write sub-circuit 126 includes a control terminal configured to receive a first scanning signal, a first terminal configured to receive a data signal, and a second terminal connected to the first terminal 132 (i.e. the second node N2) of the drive sub-circuit 122 and the data write sub-circuit 126 is configured to write the data signal into the first terminal 132 of the drive sub-circuit 122 in response to the first scanning signal Ga1. For example, the first terminal of the data write sub-circuit 126 is connected to the data line 12 for receiving the data signal, and the control terminal of the data write sub-circuit 126 is connected to the scan line 11 for receiving the first scanning signal Ga1.

For example, in a data writing phase, the data write sub-circuit 126 may be turned on in response to the first scanning signal Ga1, so that the data signal may be written into the first terminal 132 (second node N2) of the drive sub-circuit 122 and stored in the storage sub-circuit 127, so as to generate the drive current for driving the light emitting element 120 to emit light according to the data signal in, for example, the light emitting phase.

For example, the compensation sub-circuit 128 includes a control terminal configured to receive a second scanning signal Ga2, a first terminal and a second terminal electrically connected to the control terminal 131 and the second terminal 133 of the drive sub-circuit 122 respectively, the compensation sub-circuit being configured to perform threshold compensation on the drive sub-circuit 120 in response to the second scanning signal.

For example, the storage sub-circuit 127 is electrically connected to the control terminal 131 of the drive sub-circuit 122 and a first voltage terminal VDD, and is configured to store the data signal written by the data write sub-circuit 126. For example, during the data writing and compensating phase, the compensation sub-circuit 128 may be turned on in response to the second scanning signal Ga2, so that the data signal written by the data write sub-circuit 126 may be stored in the storage sub-circuit 127. For example, during the data writing and compensating phase, the compensation sub-circuit 128 may electrically connect the control terminal 131 and the second terminal 133 of the drive sub-circuit 122, so that the information related to a threshold voltage of the drive sub-circuit 122 may be correspondingly stored in the storage sub-circuit, so as to control the drive sub-circuit 122 by using the stored data signal and the threshold voltage, for example, during the light emitting phase, to allow the output of the drive sub-circuit 122 to be compensated.

For example, the first light emission control sub-circuit 123 is connected to the first terminal 132 (second node N2) of the drive sub-circuit 122 and the first voltage terminal VDD, and is configured to apply a first power voltage of the first voltage terminal VDD to the first terminal 132 of the drive sub-circuit 122 in response to a first light emission control signal. For example, as shown in FIG. 1B, the first light emission control sub-circuit 123 is connected to the first light emission control terminal EM1, the first voltage terminal VDD, and the second node N2.

For example, the second light emission control sub-circuit 124 is connected to a second light emission control terminal EM2, a first terminal 510 of the light emitting element 120, and the second terminal 132 of the drive sub-circuit 122, and the second light emission control sub-circuit 124 is configured to allow the drive current to be applied to the light emitting element 122 in response to a second light emission control signal.

For example, in the light emitting phase, the second light emission control sub-circuit 123 is turned on in response to the second light emission control signal provided by the second light emission control terminal EM2, so that the drive sub-circuit 122 may be electrically connected to the light emitting element 120 through the second light emission control sub-circuit 123, thereby driving the light emitting element 120 to emit light under the control of the drive current; in the non-light emitting phase, the second light emission control sub-circuit 123 is turned off in response to the second light emission control signal, so as to prevent the light emitting element 120 from emitting light due to the current flowing through the light emitting element 120, thereby increasing a contrast of the corresponding display device.

For another example, in an initialization phase, the second light emission control sub-circuit 124 may also be turned on in response to the second light emission control signal, so as to combine a reset circuit to perform a reset operation on the drive sub-circuit 122 and the light emitting element 120.

For example, the second light emission control signal EM2 may be the same as or different from the first light emission control signal EM1, e.g., both may be connected to the same signal output terminal or different signal output terminals.

For example, the reset circuit 129 is connected to a reset voltage terminal Vinit and the first terminal 134 (fourth node N4) of the light emitting element 122, and the reset circuit 129 is configured to apply a reset voltage to the first terminal 134 of the light emitting element 120 in response to a reset signal. In some other examples, as shown in FIG. 1B, the reset signal may also be applied to the control terminal 131 of the drive sub-circuit, i.e., the first node N1. For example, the reset signal is the second scanning signal, and the reset signal may also be another signal synchronized with the second scanning signal, which is not limited in this embodiment of the disclosure. For example, as shown in FIG. 1B, the reset circuit 129 is connected to the first terminal 134 of the light emitting element 120, the reset voltage terminal Vinit, and a reset control terminal Rst (reset control line). For example, in the initialization phase, the reset circuit 129 may be turned on in response to the reset signal, so that a reset voltage may be applied to the first terminal 134 of the light emitting element 120 and the first node N1, so as to reset the drive sub-circuit 122, the compensation sub-circuit 128, and the light emitting element 120, and eliminate the influence of the previous light emitting phase.

For example, the light emitting element 120 includes a first terminal 134 and a second terminal 135, the first terminal 134 of the light emitting element 120 is configured to be coupled to the second terminal 133 of the drive sub-circuit 122, and the second terminal 135 of the light emitting element 120 is configured to be connected to a second voltage terminal VSS. For example, in one example, as shown in FIG. 1B, the first terminal 134 of the light emitting element 120 may be connected to the third node N3 through the second light emission control sub-circuit 124, which is included but not limited by the embodiments of the present disclosure. For example, the light emitting element 120 may be various types of OLEDs, such as top emission, bottom emission, double-sided emission, etc., emitting red light, green light, blue light, white light, etc., and the first and second electrodes of the OLED serve as the first and second terminals 134 and 135 of the light emitting element respectively. The specific structure of the light emitting element is not limited in the embodiment of the present disclosure.

It should be noted that, in the description of the embodiment of the present disclosure, the first node N1, the second node N2, the third node N3, and the fourth node N4 do not necessarily represent actually existing components, but represent junctions of relevant circuit connections in a circuit diagram.

It should be noted that, in the description of the embodiments of the present disclosure, the symbol Vd may represent both the data signal terminal and a level of the data signal, and similarly, the symbols Ga1 and Ga2 may represent both the first scanning signal and the second scanning signal, and the first scanning signal terminal and the second scanning signal terminal; Rst may represent both the reset control terminal and the reset signal, symbol Vinit may represent both the reset voltage terminal and the reset voltage, symbol VDD may represent both the first voltage terminal and the first power voltage, and symbol VSS may represent both the second voltage terminal and the second power voltage. Cases are the same in the following embodiments and will not be described again.

Figure 1C:
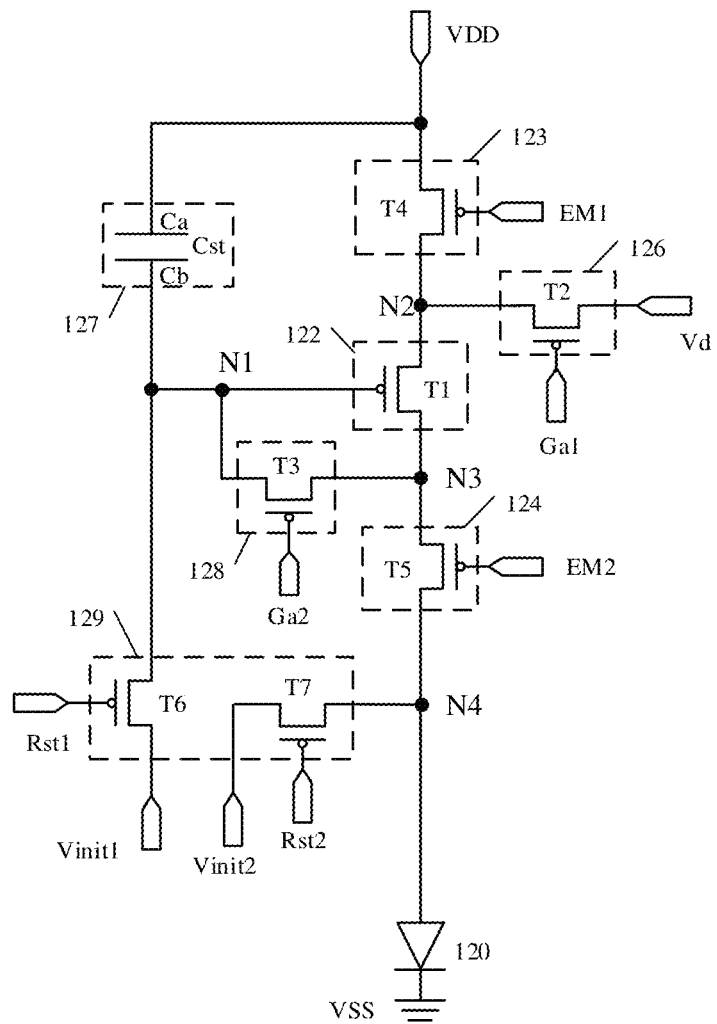
FIG. 1C is a second diagram of a pixel circuit in the display substrate according to at least one embodiment of the present disclosure.

FIG. 1C is a circuit diagram of a specific implementation example of the pixel circuit shown in FIG. 1B. As shown in FIG. 1C, the pixel circuit includes: first to seventh transistors T1, T2, T3, T4, T5, T6, T7, and a storage capacitor Cst. For example, the first transistor T1 is used as a drive transistor, and the other second to seventh transistors are used as switching transistors.

For example, as shown in FIG. 1C, the drive sub-circuit 122 may be implemented as the first transistor T1. A gate electrode of the first transistor T1 functions as the control terminal 131 of the drive sub-circuit 122 and is connected to the first node N1; a first electrode of the first transistor T1 functions as the first terminal 132 of the drive sub-circuit 122 and is connected to the second node N2; a second electrode of the first transistor T1 functions as the second terminal 133 of the drive sub-circuit 122 and is connected to the third node N3.

For example, as shown in FIG. 1C, the data write sub-circuit 126 may be implemented as the second transistor T2. A gate electrode of the second transistor T2 is connected to the first scan line (first scanning signal terminal Ga1) to receive the first scanning signal, a first electrode of the second transistor T2 is connected to the data line (data signal terminal Vd) to receive the data signal, and a second electrode of the second transistor T2 is connected to the first terminal 132 (second node N2) of the drive sub-circuit 122. For example, the second transistor T2 is a P-type transistor, such as a thin film transistor of which an active layer is made of low temperature doped polysilicon.

For example, as shown in FIG. 1C, the compensation sub-circuit 128 may be implemented as the third transistor T3. A gate electrode of the third transistor T3 is configured to be connected to the second scan line (second scanning signal terminal Ga2) to receive the second scanning signal, a first electrode of the third transistor T3 is connected to the control terminal 131 (first node N1) of the drive sub-circuit 122, and the second electrode of the third transistor T3 is connected to the second terminal 133 (third node N3) of the drive sub-circuit 122.

For example, as shown in FIG. 1C, the storage sub-circuit 127 may be implemented as the storage capacitor Cst, and the storage capacitor Cst includes a first capacitor electrode Ca and a second capacitor electrode Cb. The first capacitor electrode Ca is coupled, e.g., electrically connected, to the first voltage terminal VDD, and the second capacitor electrode Cb is coupled, e.g., electrically connected, to the control terminal 131 of the drive sub-circuit 122.

For example, as shown in FIG. 1C, the first light emission control sub-circuit 123 may be implemented as the fourth transistor T4. A gate electrode of the fourth transistor T4 is connected to the first light emission control line (first light emission control terminal EM1) to receive the first light emission control signal, a first electrode of the fourth transistor T4 is connected to the first voltage terminal VDD to receive the first power voltage, and a second electrode of the fourth transistor T4 is connected to the first terminal 132 (second node N2) of the drive sub-circuit 122.

For example, the light emitting element 120 may be implemented as an OLED, the first electrode 134 (herein, anode) of the light emitting element 120 is connected to the fourth node N4 to receive the drive current from the second terminal 133 of the drive sub-circuit 122 through the second light emission control sub-circuit 124, and the second electrode 135 (herein, cathode) of the light emitting element 120 is configured to be connected to the second voltage terminal VSS to receive the second power voltage. For example, the second voltage terminal may be grounded, i.e., VSS may be 0V.

For example, the second light emission control sub-circuit 124 may be implemented as the fifth transistor T5. A gate electrode of the fifth transistor T5 is connected to the second light emission control line (second light emission control terminal EM2) to receive the second light emission control signal, a first electrode of the fifth transistor T5 is connected to the second terminal 133 (third node N3) of the drive sub-circuit 122, and a second electrode of the fifth transistor T5 is connected to the first terminal 134 (fourth node N4) of the light emitting element 120.

For example, the reset circuit 129 may include a first reset circuit and a second reset circuit, the first reset circuit is configured to apply a first reset voltage Vini1 to the first node N1 in response to a first reset signal Rst1, and the second reset circuit is configured to apply a second reset voltage Vini2 to the fourth node N4 in response to a second reset signal Rst2. For example, as shown in FIG. 1C, the first reset circuit is implemented as the sixth transistor T6, and the second reset circuit is implemented as the seventh transistor T7. A gate electrode of the sixth transistor T6 is configured to be connected to a first reset control terminal Rst1 to receive the first reset signal Rst1, a first electrode of the sixth transistor T6 is connected to a first reset voltage terminal Vinit1 to receive the first reset voltage Vinit1, and a second electrode of the sixth transistor T6 is configured to be connected to the first node N1. A gate electrode of the seventh transistor T7 is configured to be connected to a second reset control terminal Rst2 to receive the second reset signal Rst2, a first electrode of the seventh transistor T7 is connected to the second reset voltage terminal Vinit2 to receive a second reset voltage Vinit2, and a second electrode of the seventh transistor T7 is configured to be connected to the fourth node N4.

It should be noted that the transistors used in the embodiments of the present disclosure may be thin film transistors, field effect transistors, or other switching devices with the same characteristics, and the thin film transistors are taken as examples in the embodiments of the present disclosure for illustration. The source and drain of the transistor used herein may be symmetrical in structure, so that there may be no difference in structure between the source and drain. In the embodiments of the present disclosure, in order to distinguish two electrodes of a transistor except for a gate electrode, one of the two electrodes is directly described as a first electrode, and the other electrode is directly described as a second electrode.

Figure 2:
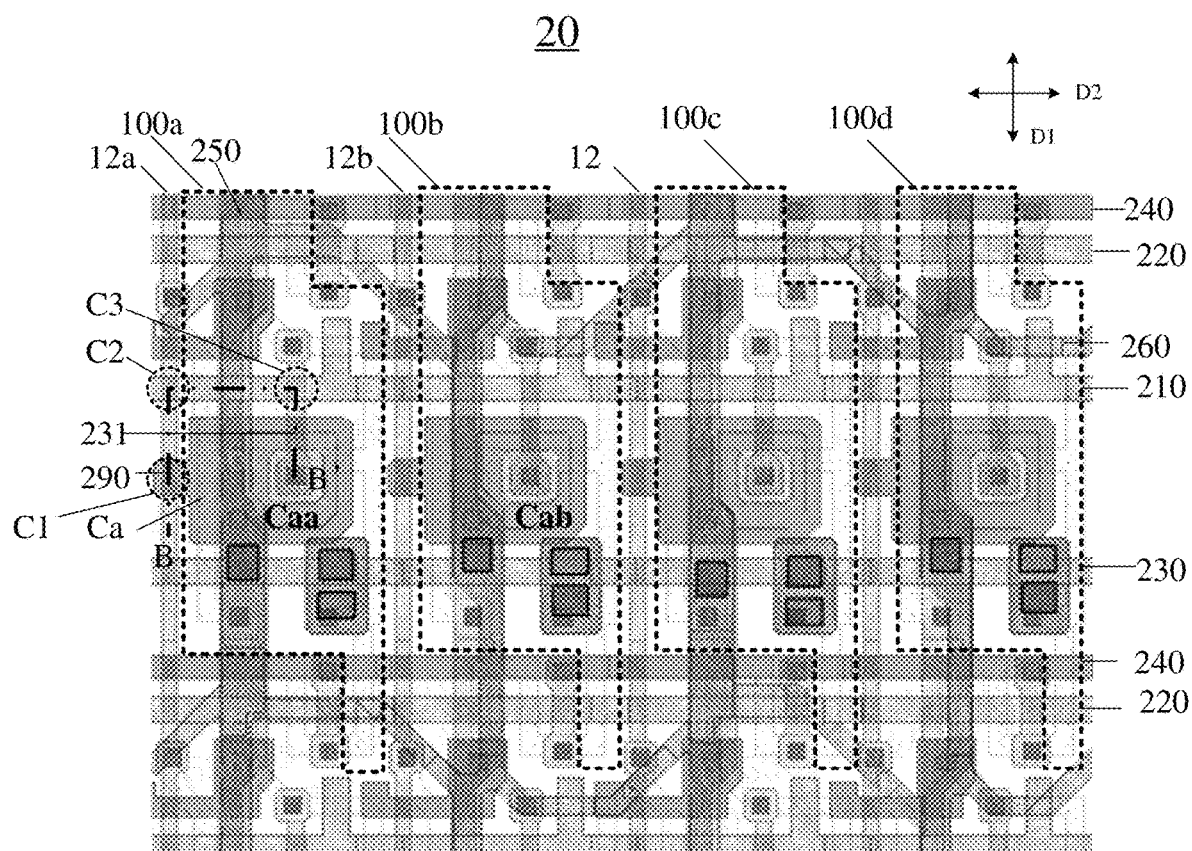
FIG. 2 is a second schematic diagram of a display substrate according to at least one embodiment of the disclosure.

FIG. 2 is a schematic diagram of a display substrate 20 according to at least one embodiment of the present disclosure. The display substrate 20 includes a base substrate 101, and a plurality of sub-pixels 100 is disposed on the base substrate 101. The pixel circuits of the plurality of sub-pixels 100 are arranged as a pixel circuit array having a column direction as a first direction D1 and a row direction as a second direction D2, the first direction D1 intersecting with, e.g., orthogonal to, the second direction D2. In some embodiments, the first direction D1 may also be the row direction, and the second direction D2 may also be the column direction. In some embodiments, the pixel circuits of the respective sub-pixels may have the identical structure except for a connection structure with the light emitting element; that is, the pixel circuits are arranged in the row and column directions repeatedly, and the connection structure with the light emitting element of different sub-pixels may be different according to the shape and position layout of the electrodes of the light emitting structure of the respective sub-pixels. In some embodiments, the general frame of the pixel circuits of the sub-pixels of different colors, such as the shapes and positions of respective signal lines, are substantially the same, and the relative positional relationship of between transistors is also substantially the same, but the width and shape of some signal lines or connecting lines, or the channel size and shape of some transistors, or the position of connecting lines or via holes for connecting with the light emitting elements of different sub-pixels, for example, may be different, and may be adjusted according to the respective layout structures and the arrangement of the sub-pixels. FIG. 2 exemplarily shows four directly adjacent sub-pixels (i.e., a first sub-pixel 100a, a second sub-pixel 100b, a third sub-pixel 100c, and a fourth sub-pixel 100d) in one row of sub-pixels, and the embodiment of the present disclosure is not limited to this layout.

Figure 3A:
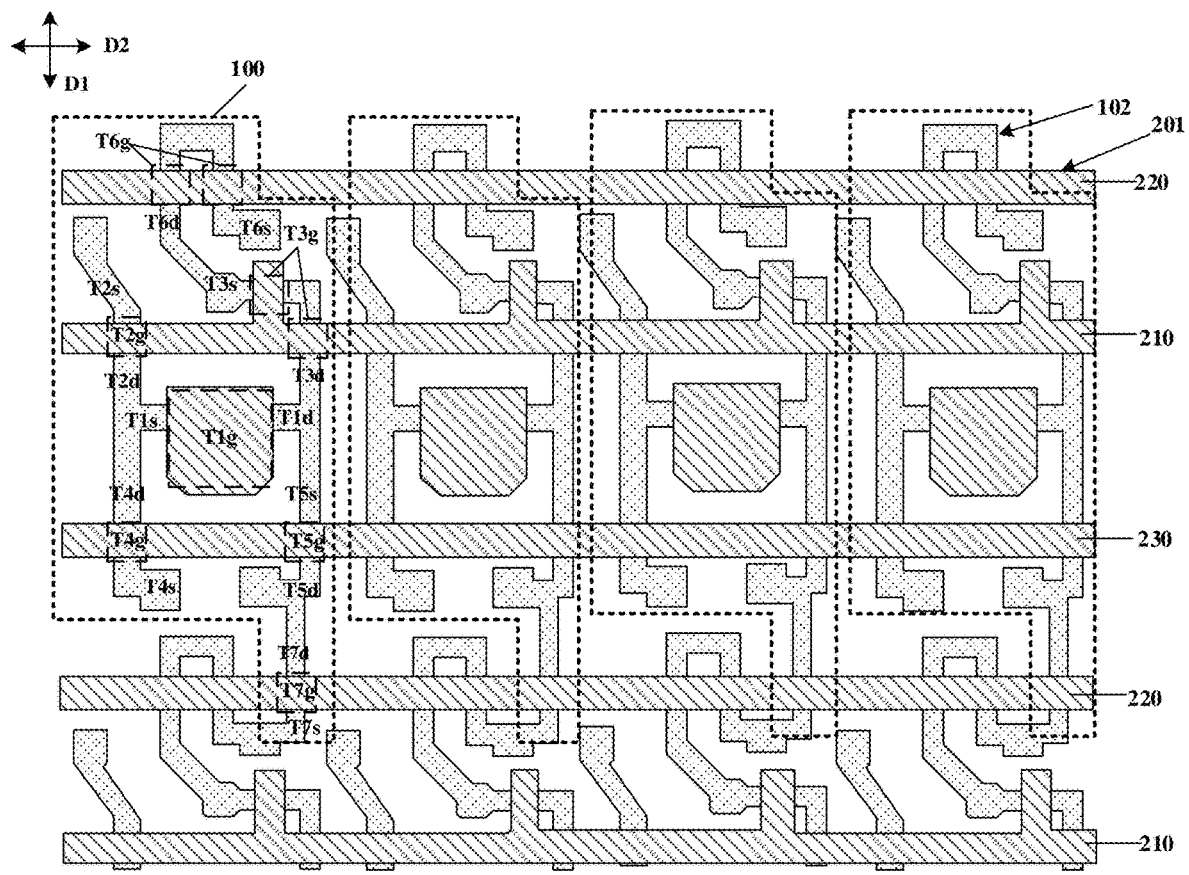
FIG. 3A is a third schematic diagram of a display substrate according to at least one embodiment of the disclosure.
Figure 3B:
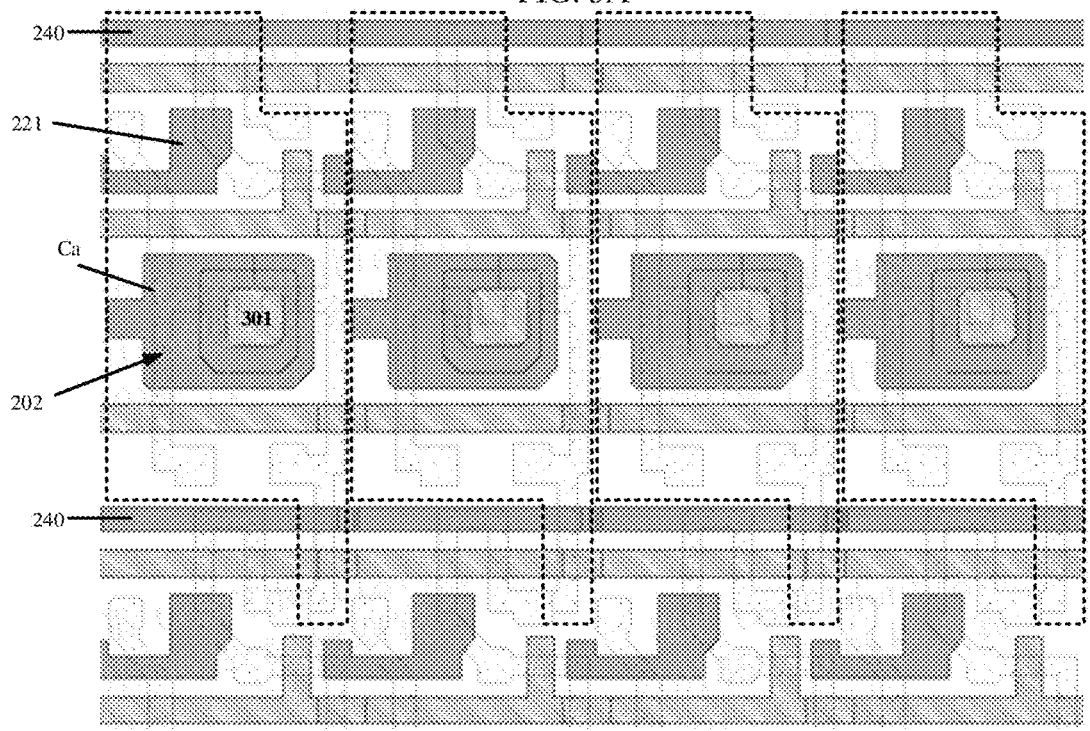
FIG. 3B is a fourth schematic diagram of a display substrate according to at least one embodiment of the disclosure.
Figure 3C:
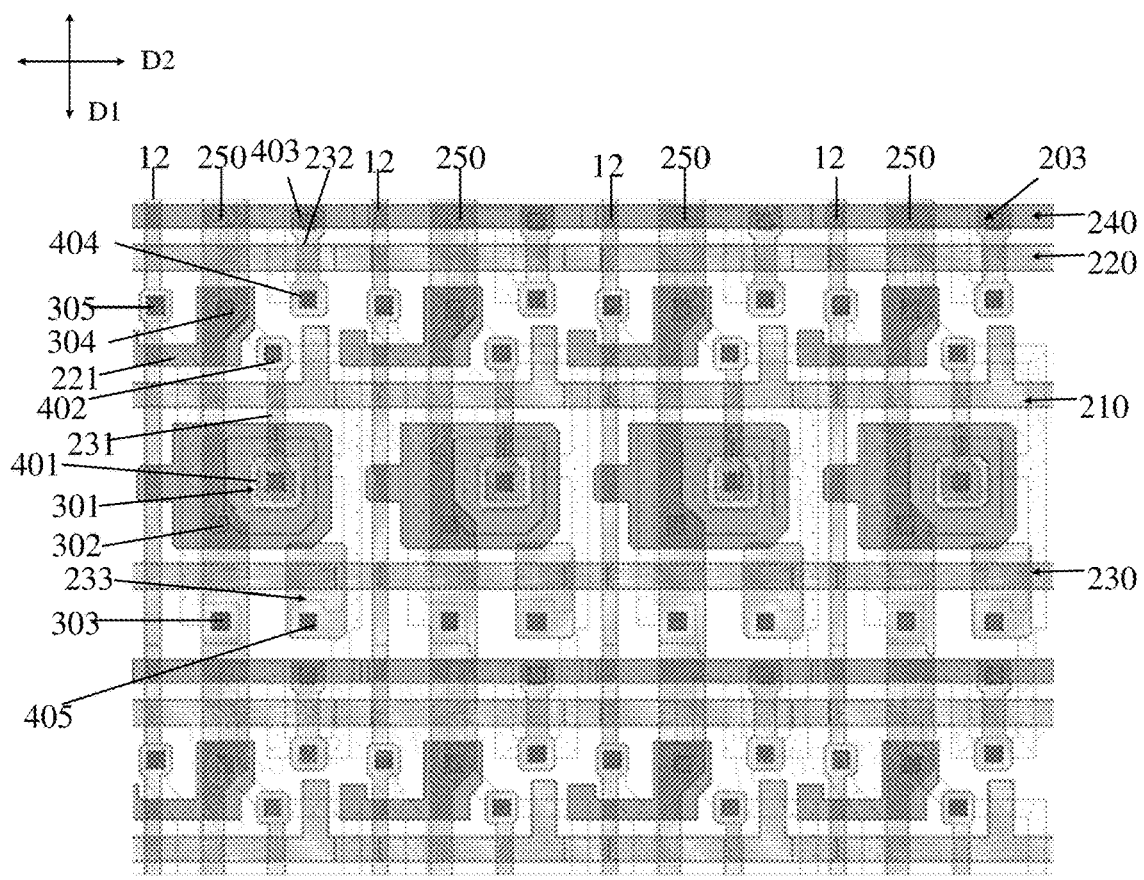
FIG. 3C is a fifth schematic diagram of a display substrate according to at least one embodiment of the disclosure.
Figure 3D:
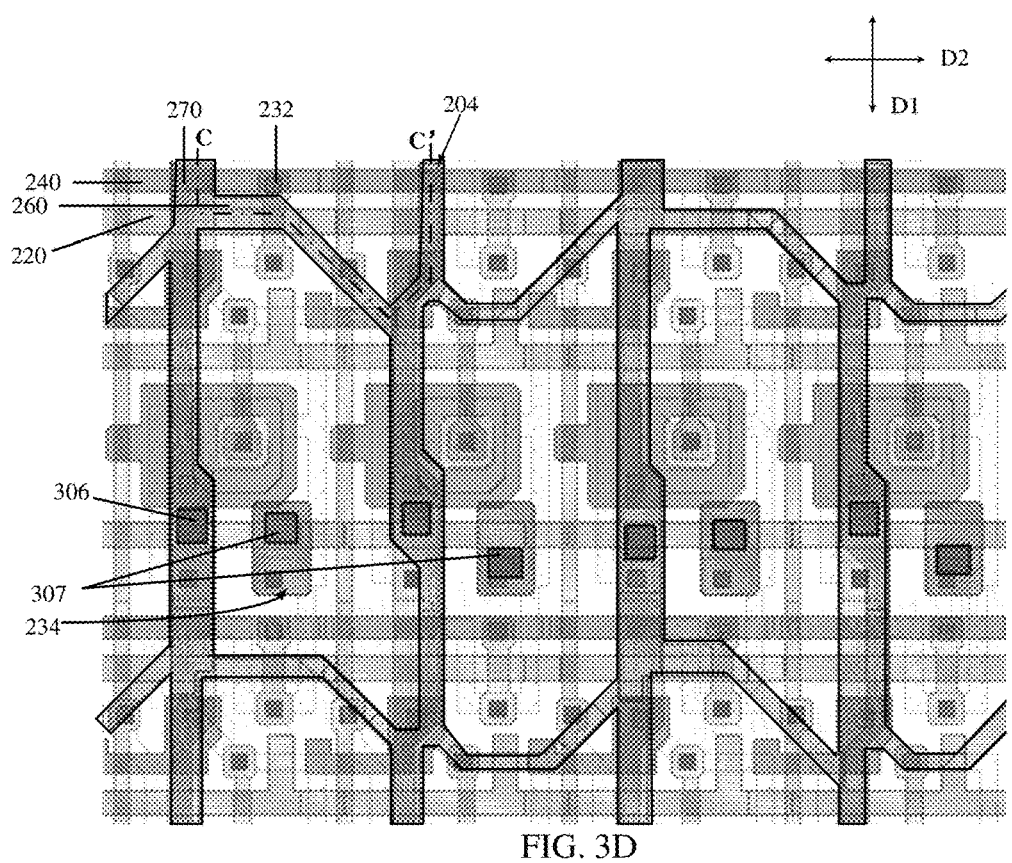
FIG. 3D is a sixth schematic diagram of a display substrate according to at least one embodiment of the present disclosure.

FIG. 3A illustrates a semiconductor layer 102 and a first conductive layer (gate electrode layer) 201 of the transistors T1-T7 in the four sub-pixels 100 corresponding to FIG. 2, FIG. 3B further illustrates a second conductive layer 202 on the basis of FIG. 3A, FIG. 3C further shows a third conductive layer 203 on the basis of FIG. 3B, and FIG. 3D further shows a fourth conductive layer 204 on the basis of FIG. 3C. It should be noted that the corresponding structures of four adjacent sub-pixels in a row of sub-pixels are merely schematically shown, but this should not be taken as a limitation to the present disclosure. The semiconductor layer 102, the first conductive layer 201, the second conductive layer 202, the third conductive layer 203, and the fourth conductive layer 204 are disposed on the base substrate 101 successively, thereby forming the structure of the display substrate as shown in FIG. 2.

For convenience of explanation, the gate electrode, the first electrode, the second electrode, and the active layer of the nth transistor Tn are denoted by Tng, Tns, Tnd, Tna respectively in the following description, wherein n is 1 to 7.

It should be noted that "disposed in the same layer" in the present disclosure refers to a structure formed by two (or more) structures being formed by the same deposition process and patterned by the same patterning process, and the materials thereof may be the same or different. The "integral structure" in the present disclosure means a structure in which two (or more) structures are connected to each other by being formed through the same deposition process and patterned through the same patterning process, and their materials may be the same or different.

For example, as shown in FIG. 3A, the first conductive layer 201 includes a gate electrode of each transistor and some scan lines and control lines. In FIG. 2B, the region where each sub-pixel 100 is located is shown by a large dotted-line frame, and the gate electrodes T1g to T7g of the first to seventh transistors T1 to T7 in one sub-pixel 100 are shown by a small dotted-line frame.

The semiconductor layer 102 includes active layers T1a to T7a of the first to seventh transistors T1 to T7. As shown in FIG. 3A, the active layers T1a to T7a of the first to seventh transistors T1 to T7 are connected to one another integrally. For example, the semiconductor layer 20 in each column of sub-pixels is connected to one another integrally, and the semiconductor layers in two adjacent columns of sub-pixels are spaced apart from one another.

For example, as shown in FIG. 3A, the first conductive layer 104 includes the gate electrodes T1g-T7g of first to seventh transistors T1-T7. For example, the third transistor T3 and the sixth transistor T6 have a double-gate electrode structure, which may improve the gate control capability of the transistor and reduce a leakage current.

For example, the first conductive layer 104 further includes a plurality of scan lines 210, a plurality of reset control lines 220, and a plurality of light emission control lines 230 insulated from one another. For example, each row of sub-pixels is correspondingly connected to one scan line 210, one reset control line 220, and one light emission control line 230 respectively.

The scan line 210 is electrically connected (or integrated) with the gate electrode of the second transistor T2 in the one corresponding row of sub-pixels to provide the first scanning signal Ga1, the reset control line 220 is electrically connected with the gate electrode of the sixth transistor T6 in the one corresponding row of sub-pixels to provide the first reset signal Rst1, and the light emission control line 230 is electrically connected with the gate electrode of the fourth transistor T4 in the one corresponding row of sub-pixels to provide the first light emission control signal EM1.

For example, as shown in FIG. 3A, the scan line 210 is further electrically connected to the gate electrode of the third transistor T3 to provide the second scanning signal Ga2, i.e. the first scanning signal Ga1 and the second scanning signal Ga2 may be the same signal; the light emission control line 230 is also electrically connected to the gate electrode of the fifth transistor T5 to provide the second light emission control signal EM2, that is, the first light emission control signal EM1 and the second light emission control signal EM2 are the same signal.

For example, as shown in FIG. 3A, the gate electrode of the seventh transistor T7 of the current row of pixel circuits is electrically connected to the reset control line 220 corresponding to the next row of pixel circuits (i.e., the pixel circuit row where the scan line that is sequentially turned on after the scan line in the present row is located in a scan order of the scan lines) to receive the second reset signal Rst2.

For example, from FIG. 3A, the gate electrode line 11 dividing the pixel region in the column direction (first direction D1) may be the reset control line 220 or the light emission control line 230, and each pixel circuit region includes a portion of each of the reset control line 220, the light emission control line 230, and the scan line 210.

For example, as shown in FIG. 3A, the display substrate 20 adopts a self-alignment process, and the semiconductor layer 102 is conducted (e.g., doped) by using the first conductive layer 201 as a mask, so that the portion of the semiconductor layer 102 not covered by the second conductive layer 502 is conducted, so that the portions of the active layer of each transistor on both sides of the channel region are conducted to form the first electrode and the second electrode of the transistor respectively.

For example, as shown in FIG. 3B, the second conductive layer 202 includes the first capacitor electrode Ca. The first capacitor electrode Ca is overlapped with the gate electrode T1g of the first transistor T1 in a direction perpendicular to the base substrate 101 to form the storage capacitor Cst, that is, the gate electrode T1g of the first transistor T1 serves as the second capacitor electrode Cb of the storage capacitor Cst. For example, the first capacitor electrode Ca includes a via hole 301 exposing at least a portion of the gate electrode T1g of the first transistor T1, so that the gate electrode T1g may be electrically connected to other structures.

For example, the second conductive layer 202 may further include a plurality of reset voltage lines 240, and the plurality of reset voltage lines 240 are connected to the plurality of rows of sub-pixels in one-to-one correspondence. The reset voltage line 240 is electrically connected to the first electrodes of the sixth transistors T6 in one corresponding row of sub-pixels to provide the first reset voltage Vinit1.

For example, as shown in FIG. 3B, the first electrodes of the seventh transistors T7 of the current row of sub-pixels are electrically connected to the reset voltage line 240 corresponding to the next row of sub-pixels to receive the second reset voltage Vinit2.

For example, as shown in FIG. 3B, the second conductive layer 202 may further include a shielding electrode 221, and the shielding electrode 221 is overlapped with the first electrode T2s of the second transistor T2 in the direction perpendicular to the base substrate 101, so as to protect a signal in the first electrode T2s of the second transistor T2 against the interruption of other signals. Because the first electrode T2s of the second transistor T2 is configured to receive the data signal Vd which determines a gray level of the sub-pixel, the shielding electrode 221 improves the stability of the data signal, thereby improving the display performance.

For example, as shown in FIG. 3C, the third conductive layer 203 includes a plurality of first power lines 250 extended in the first direction D1. For example, the plurality of first power lines 250 are electrically connected to the plurality of columns of sub-pixels in one-to-one correspondence to provide the first power voltage VDD. The first power line 250 is electrically connected to the first capacitor electrode Ca in one corresponding column of sub-pixels through a via hole 302, and is electrically connected to the first electrode of the fourth transistor T4 through a via hole 303. For example, the first power line 250 is also electrically connected to the shielding electrode 221 through a via hole 304, so that the shielding electrode 221 has a fixed potential, which improves the shielding capability of the shielding electrode.

For example, the third conductive layer 203 further includes the plurality of data lines 12. The plurality of data lines 12 are electrically connected to the plurality of columns of sub-pixels in one-to-one correspondence to provide data signals. For example, the data line 12 is electrically connected to the first electrode T2s of the second transistor T2 in one corresponding column of sub-pixels through a via hole 305 to provide the data signal.

Specifically, in consideration of uniformity and reliability of a process margin, the via holes are usually arranged in the row and column directions. The via hole 304 and the via hole 305 are substantially located in the same straight line in the row direction, and the via hole 304 is located on the side, which is away from the data line 12, of the via hole 305 connecting the data line 12 and the first electrode T2s of the second transistor T2. For example, the via hole 305 is located at a position where the data line is overlapped with the first electrode T2s of the second transistor T2 (e.g., an end portion of the first electrode T2s of the second transistor T2, i.e., an end portion of the semiconductor layer 102 on the left side), and the via hole 304 is located at a position covered by the first power line 250.

In some embodiments, the data line 12 is located on the left side of the first power line 250, and the data line 12 and the first power line 250 both extend in the column direction. The first shielding electrode 221 extends downwards by a distance from a position covering the via hole 304 and extends to the left side at a position not exceeding the scan line and covers a portion of the first electrode T2s of the second transistor T2, and the shape of the first shielding electrode 221 is substantially an L-shaped left and right mirror image pattern. In this embodiment, it should be noted that the left side refers to a side of the data line relative to the first power line; for example, a boundary in the row direction that defines a region of one pixel circuit is approximately a data line of the one pixel circuit and a data line of a next (for example, right adjacent) pixel circuit in the same row, that is, a portion between two adjacent data lines and the data line of the pixel circuit together form a range of the pixel circuit in the row direction. In other embodiments, the first power line, the reset signal line, or the like is designed as a boundary of the pixel circuit division as needed.

For example, as shown in FIG. 3C, the third conductive layer 203 further includes a first connection electrode 231 (an example of a first connection electrode in the embodiment of the present disclosure), one terminal of the first connection electrode 231 is electrically connected to the gate electrode T1g of the first transistor T1, i.e., the second capacitor electrode Cb, through the via hole 301 in the first capacitor electrode Ca and a via hole 401 in an insulating layer, and the other terminal is electrically connected to the first electrode of the third transistor T3 through a via hole 402, thereby electrically connecting the second capacitor electrode Cb to the first electrode T3s of the third transistor T3. For example, the via hole 401 penetrates through a second insulating layer 104 and a third insulating layer 105, and the via hole 402 penetrates through a first insulating layer 103, the second insulating layer 104, and the third insulating layer 105 (referring to FIG. 5).

For example, as shown in FIG. 3C, the third conductive layer 203 further includes a second connection electrode 232, one terminal of the second connection electrode 232 is electrically connected to the reset voltage line through a via hole 403, and the other terminal is electrically connected to the sixth transistor T6 through a via hole 404, so that the first electrode T6s of the sixth transistor T6 may receive the first reset voltage Vinit1 from the reset voltage line 240. For example, the via hole 403 penetrates through the third insulating layer 105, and the via hole 404 penetrates through the first insulating layer 103, the second insulating layer 104, and the third insulating layer 105 (referring to FIG. 5).

For example, as shown in FIG. 3C, the third conductive layer 203 further includes a third connection electrode 233 (an example of the second connection electrode of the embodiment of the present disclosure). The third connection electrode 233 is electrically connected to the second electrode T5d of the fifth transistor T5 through a via hole 405, and is configured to electrically connect the second electrode T5d of the fifth transistor T5 to the first electrode 134 of the light emitting element, and for example, the via hole 405 penetrates through the first insulating layer 103, the second insulating layer 104, and the third insulating layer 105 (referring to FIG. 5), which will be described in detail later.

For example, as shown in FIG. 3D, the fourth conductive layer 204 includes a second power line 260 extended in the second direction D2 and the second power line 260 is electrically connected with the plurality of first power lines 250, so as to form a mesh-shaped power line structure. This structure helps to reduce the resistance on the power line and thus a voltage drop of the power line, so as to uniformly transmit the first power voltage to the respective sub-pixels of the display substrate.

For example, the fourth conductive layer 204 further includes a plurality of third power lines 270, and the third power lines 270 extend in the first direction D1 and are electrically connected to the plurality of first power lines 250 in one-to-one correspondence. As shown in FIG. 3D, the third power line 270 and the corresponding first power line 250 are overlapped with each other at least partially in the direction perpendicular to the base substrate 101 and are electrically connected to each other through a via hole 306. For example, one via hole 306 is respectively disposed corresponding to each of the sub-pixels, so that each of the third power lines 270 forms a parallel structure with the corresponding first power line 250, which helps to reduce the resistance of the power line. In some embodiments, in order to avoid certain structures, such as via holes or connection lines, or to make an upper layer structure flat, the first power line 250 in the third conductive layer may be widened or narrowed in line width at partial positions. In some embodiments, in order to avoid certain structures, such as via holes or connection lines, or to make the upper layer structure flat, the third power line 270 in the fourth conductive layer may be widened or narrowed in line width at some positions. Thus, the third power line 270 and the corresponding first power line 250 may not be completely overlapped in the direction perpendicular to the base substrate 101 at some positions.

For example, the second power line 260 and the third power line 270 are electrically connected to each other or are integrated, so that the plurality of first power lines 250, the plurality of second power lines 260, and the plurality of third power lines 270 are formed in a mesh-shaped power line structure.

For example, the fourth conductive layer 204 further includes a fourth connection electrode 234 (an example of the third connection electrode of the embodiment of the present disclosure) insulated from the third power line 270, and the fourth connection electrode 234 is electrically connected to the third connection electrode 233 through a via hole 307 to electrically connect the second electrode T5d of the fifth transistor T5 to the first electrode 134 of the light emitting element. For example, the fourth connection electrode 234 and the third connection electrode 233 are at least partially overlapped in the direction perpendicular to the base substrate 101.

Figure 4:
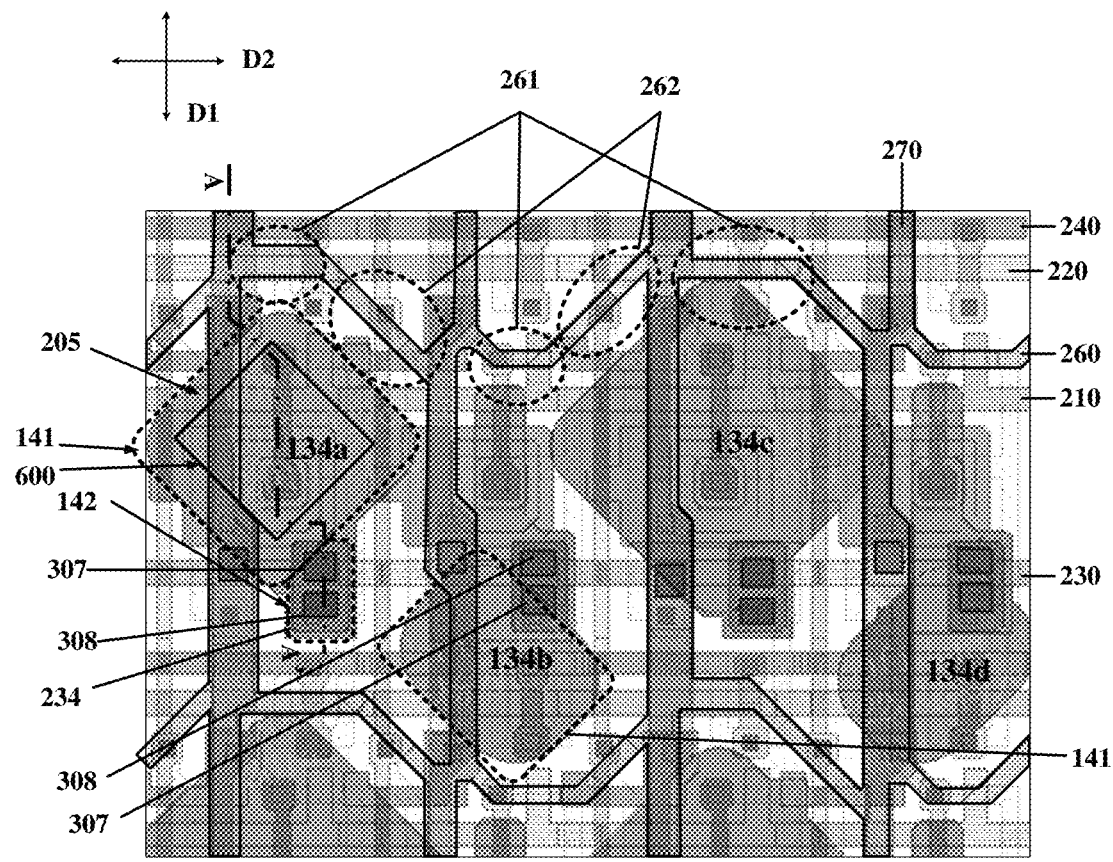
FIG. 4 is a seventh schematic diagram of a display substrate according to at least one embodiment of the disclosure.
Figure 5:
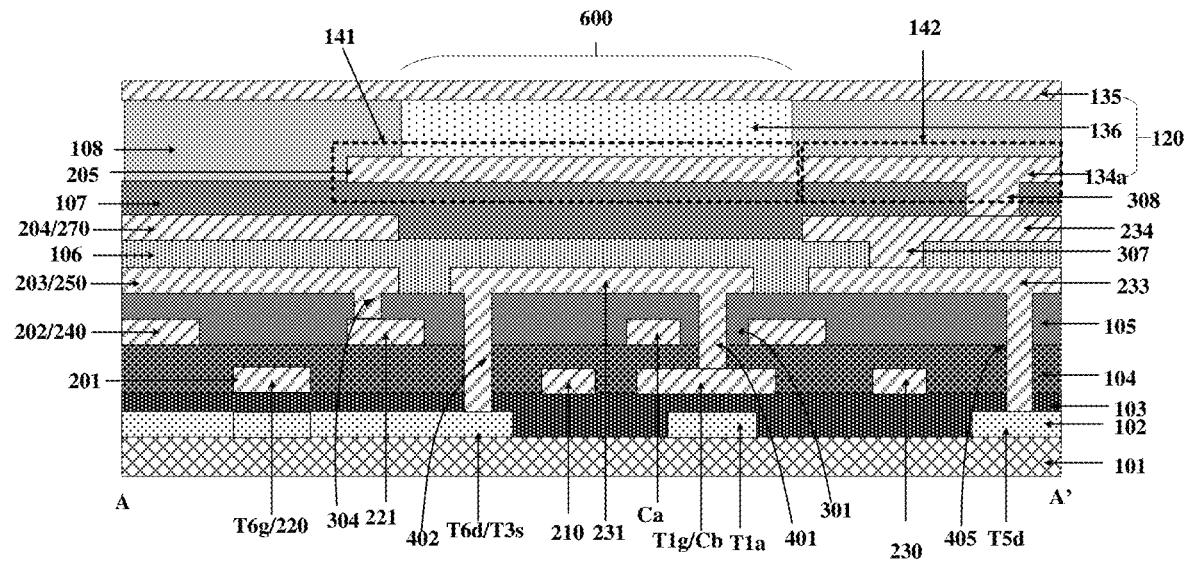
FIG. 5 is a sectional view of FIG. 4 along section line A-A'.

FIG. 4 further shows a fifth conductive layer 205 on the basis of FIG. 3D, and the fifth conductive layer 205 includes the first electrode 134 of the light emitting element 120. FIG. 5 shows a sectional view of FIG. 4 along section line A-A'.

As shown in FIG. 5, the semiconductor layer 102, the first insulating layer 103, the first conductive layer 201, the second insulating layer 104, the second conductive layer 202, the third insulating layer 105, the third conductive layer 203, the fourth insulating layer 106, the fourth conductive layer 204, the fifth insulating layer 107, and the fifth conductive layer 205 are disposed on the base substrate 101 successively, so as to form the structure of the display substrate shown in FIG. 4.

As shown in FIGS. 4 and 5, the first electrode 134 may include a body portion 141 and a connection portion 142, the body portion 141 is mainly used for driving the light emitting layer to emit light, an orthogonal projection of the body portion 141 on the base substrate 101 covers an orthogonal projection of an opening region 600 of the sub-pixel to which the first electrode belongs on the base substrate, and the connection portion 142 is mainly used for connecting with the pixel circuit. As shown in FIG. 4, the second power line 260 is not overlapped with each first electrode 134 in the direction perpendicular to the base substrate 101. Such an arrangement may avoid display problems, such as color shift, due to unevenness of the first electrode 134 of the light emitting element caused by overlapping with the second power line 260. A pixel defining layer is formed on the first electrode 134, an opening region 600 is formed on the pixel defining layer, the opening region 600 exposes at least a portion of the body portion 141 of the first electrode 134 and defines the light emitting region (opening region) of each corresponding sub-pixel, and the light emitting layer of the light emitting element 120 is formed at least in the opening region of the pixel defining layer. The flatness of the first electrode 134 directly affects the uniformity of the emitted light from the light emitting layer, thereby affecting the display effect. For example, the second power line 260 may have a curved structure to fit the pattern of the first electrode 134, such as a polyline or a wavy line. For example, two adjacent second power lines 260 define a row of sub-pixels 100. For example, as shown in FIG. 4, the second power line 260 includes a first portion 261 and a second portion 262 alternately connected, the first portion 261 has an extension direction parallel to each other and to the second direction D2, and the second portion 262 has an extension direction intersecting with both the first direction D1 and the second direction D2. For example, the body portion 141 of the first electrode 134 is shaped in a quadrilateral, for example, each of the first portions 261 is disposed corresponding to one vertice of the body portion 141 of one of the first electrodes 134, and the second portion 262 adjacent to the first portion 261 is disposed in parallel with one side of the body portion 141.

Figure 3E:
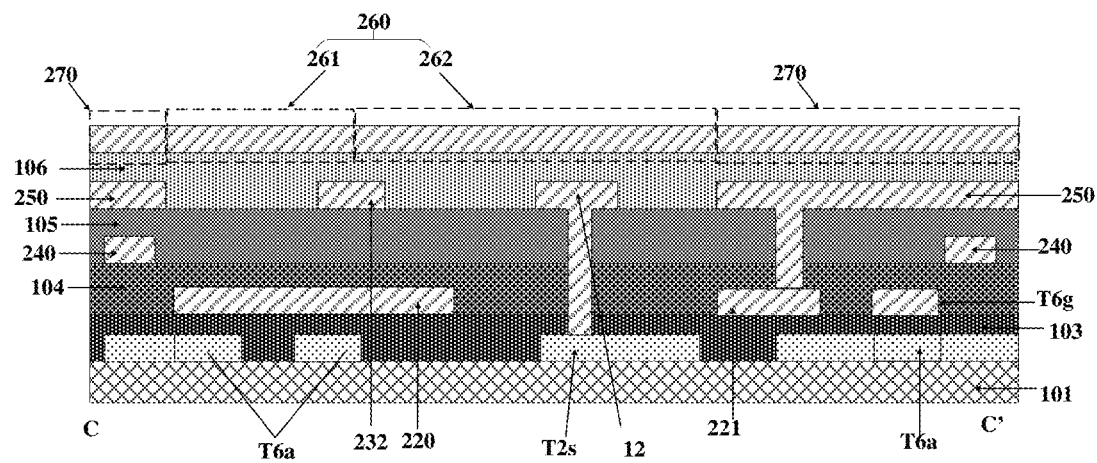
FIG. 3E is a sectional view of FIG. 3D along section line C-C'.

FIG. 3E shows a sectional view of FIG. 3D along section line C-C'. As shown in FIG. 3E, the first portion 261 of the second power line 260 is overlapped with the reset control line 220 in the direction perpendicular to the base substrate 101; the second portion 262 is overlapped with one data line 12 in the direction perpendicular to the base substrate 101, and the data line 12 is electrically connected to a column of pixel circuits corresponding to the second portion 262 to provide the data signal.

FIG. 4 shows the first electrodes 134a, 134b, 134c and 134d of the four adjacent sub-pixels. For example, the first sub-pixel 100a, the second sub-pixel 100b, the third sub-pixel 100c and the fourth sub-pixel 100d constitute a repetitive unit of the display substrate 20.

For example, in each repetitive unit, the color of light emitted by the light emitting element of the second sub-pixel 100b is the same as the color of light emitted by the light emitting element of the fourth sub-pixel 100d. That is, the second sub-pixel 100b and the fourth sub-pixel 100d are sub-pixels of the same color. For example, the second sub-pixel 100b and the fourth sub-pixel 100d are sensitive color sub-pixels, and when the display substrate 20 adopts a red-green-blue (RGB) display mode, the above-mentioned sensitive color is green, that is, the second sub-pixel 100b and the fourth sub-pixel 100d are both green sub-pixels. For example, the first sub-pixel 100a may be a red sub-pixel, and the third sub-pixel 100c may be a blue sub-pixel.

For example, in each repetitive unit, the first sub-pixel 100a and the third sub-pixel 100c are alternately arranged in the row direction, and the second sub-pixel 100b is between adjacent first sub-pixel 100a and third sub-pixel 100c, and the fourth sub-pixel 100d is between the third sub-pixel 100c and the first sub-pixel 100a in the next repetitive unit respectively.

For example, in each repetitive unit, the first sub-pixels 100a and the third sub-pixels 100c are alternately arranged in the column direction. In the two adjacent rows of repetitive units, two first sub-pixels 100a and two third sub-pixels 100c located in two rows and two columns form a 2×2 matrix, in which, two first sub-pixels 100a are located at one diagonal position of the matrix, two third sub-pixels 100c are located at the other diagonal position of the matrix, and the two first sub-pixels 100a and the two third sub-pixels 100c surround one second sub-pixel 100b or fourth sub-pixel 100d. The 2×2 matrix is repeated in the row and column directions in the manner of sharing one column or row of sub-pixels.

For example, four sub-pixels in each repetitive unit may form two virtual pixels, and the first sub-pixel 100a and the third sub-pixel 100c in the repetitive unit are shared by the two virtual pixels respectively. For example, as shown in FIG. 4, the first sub-pixel 100a and the second sub-pixel 100b located at the right side thereof and adjacent thereto constitute one virtual pixel, and a light emitting pixel unit is formed by the third sub-pixel 100c in the adjacent (right) virtual pixel; the third sub-pixel 100c and the fourth sub-pixel 100d located at the right side thereof and adjacent thereto constitute one virtual pixel, and a light emitting pixel unit is formed by the first sub-pixel 100a adjacent thereto (not shown at the right side). The sub-pixels in the plurality of repetitive units form a pixel array, and a sub-pixel density is 1.5 times a virtual pixel density in the row direction of the pixel array and 1.5 times a virtual pixel density in the column direction of the pixel array.

For example, the second sub-pixel 100b and the fourth sub-pixel 100d belong to two virtual pixels respectively.

It should be noted that first, because the first sub-pixel 100a and the third sub-pixel 100c are shared by two adjacent virtual pixels, the boundary of each virtual pixel is also very blurred, and thus the shape of each virtual pixel is not limited in the embodiment of the present disclosure. Secondly, the division of the virtual pixels is related to a drive manner, and the specific division manner of the virtual pixels may be determined according to the actual drive manner, which is not specifically limited in the present disclosure.

For example, the shape and size of the plurality of opening regions corresponding to the sub-pixels 100 may be changed according to the light emitting efficiency, the service life, or the like, of the light emitting materials emitting different colors of light, and for example, the corresponding opening region of the light emitting material having a shorter light emitting life may be set larger, thereby improving the stability of light emission. For example, the size of the opening region of the blue sub-pixel, the red sub-pixel, and the green sub-pixel may be reduced successively. Since the opening region is disposed on the first electrode 134, accordingly, as shown in FIG. 4, the areas of the first electrodes 134a, 121b, 121c, and 121d of the first, second, third, and fourth sub-pixels 100a, 100b, 100c, and 100d are reduced successively.

For each row of sub-pixels, the body portions of the first electrodes of the light emitting elements of the sub-pixels are arranged in the second direction and are staggered in the first direction. The body portion of the first electrode and the first capacitor electrode of one of any two sub-pixels adjacent in the second direction are overlapped in the direction perpendicular to the base substrate, and the body portion of the first electrode and the first capacitor electrode of the other one sub-pixel are not overlapped in the direction perpendicular to the base substrate. For example, as shown in FIG. 4, the first electrode 134b/134d of the green sub-pixel having the smallest area is disposed between the first electrode 134a of each adjacent red sub-pixel (first sub-pixel 100a) and the first electrode 134c of the blue sub-pixel (third sub-pixel 100c), and the body portions of the first electrodes 134b/134d and the body portions of the first electrodes 134a, 134c are disposed alternately in the second direction. For example, the body portions of the first electrodes 134a and 134c are overlapped with the first capacitor electrodes Ca in the respective sub-pixels in the direction perpendicular to the base substrate, and the body portions of the first electrodes 134b and 134d are not overlapped with the first capacitor electrodes Ca in the respective sub-pixels in the direction perpendicular to the base substrate. Therefore, a space utilization rate of the layout may be improved, and the pixel density is improved. As shown in FIG. 4, the body portion 141 of each first electrode extends in a zigzag shape in the second direction D2.

For example, for the repetitive unit row, the body portions of the first electrodes 134 of the first sub-pixel 100a and the third sub-pixel 100c are, for example, quadrangular and arranged in the row and column directions with the vertex angles thereof facing each other, and the second power line 260 extends along an outline of a side of the first electrodes 134 of the first sub-pixel 100a and the third sub-pixel 100c away from the second sub-pixel 100b and the fourth sub-pixel 100d. For example, the second sub-pixel 100b and the fourth sub-pixel 100d are located between two corresponding adjacent sub-pixels of a sub-pixel row formed by the first sub-pixel 100a and the third sub-pixel 100c in the row direction, i.e., the direction D2, the body portion of the first electrode 134 of the second sub-pixel 100b and the fourth sub-pixel 100D is, for example, quadrilateral, the body portion of the first electrode 134 of each adjacent sub-pixel has opposite and parallel sides, and the second power line 260 extends along the outline of a side of the first electrode 134 of the first sub-pixel 100a and the third sub-pixel 100c away from the second sub-pixel 100b and the fourth sub-pixel 100d, and also along an outline of a side of the first electrode 134 of the second sub-pixel 100b and the fourth sub-pixel 100D away from the first sub-pixel 100a and the third sub-pixel 100c. For example, the second power line 260 extends along gaps between the first electrode 134 of the sub-pixel row formed by the first sub-pixel 100a and the third sub-pixel 100c and the first electrode 134 of the sub-pixel row formed by the second sub-pixel 100b and the fourth sub-pixel 100d and is formed in a wave shape, formed in a peak at an electrode vertice position of the body portion corresponding to the first electrode 134 of the first sub-pixel 100a and the third sub-pixel 100c and in a valley at an electrode vertice position of the body portion corresponding to the first electrode 134 of the second sub-pixel 100b and the fourth sub-pixel 100d. The direction close to the upper row is a protruding direction of the peak, and the direction close to the lower row is a protruding direction of the valley. For example, as shown in FIGS. 4 and 5, the connection portion 142 of the first electrode 134 of each sub-pixel is electrically connected to the fourth connection electrode 234 through the via hole 308, so that the second electrode T5d of the fifth transistor T5 is electrically connected to the first electrode 134 of the light emitting element 120. For example, the connection portion 142 of the first electrode 134 and the fourth connection electrode 234 are at least partially overlapped with each other in the direction perpendicular to the base substrate 101.

For example, the opening region 600 is not overlapped with the connection portion 142 of the first electrode 134 in the direction perpendicular to the base substrate 101, and the via hole 307 and the via hole 308 are both overlapped with the connection portion 142 of the first electrode 134 in the direction perpendicular to the base substrate 101, so as to avoid influence to the light emitting quality due to the via hole 308 and the via hole 307 affecting the flatness of the light emitting layer in the opening region. In some embodiments, the via hole 307 may be partially overlapped with the opening region, and because at least the layer where the fourth connection electrode 234 is located and the insulating layer where the via hole 308 is located are located between the layer where the via hole 307 is located and the layer where the first electrode 134 is located, the influence of the via hole 307 on the flatness of the opening region is less than the influence of the via hole 308 on the flatness of the opening region.

For example, for the first sub-pixel 100a and the third sub-pixel 100c, the corresponding fourth connection electrode is located on a side of the first electrode 134 away from the reset control line 220 in the pixel circuit; correspondingly, the connection electrode of the first electrode 134 is also located on a side of the first electrode 134 away from the reset control line 220 in the pixel circuit, and the connection electrode of the first electrode 134 is at least partially overlapped with the corresponding fourth connection electrode.

For example, for the second sub-pixel 100b and the fourth sub-pixel 100d, the corresponding fourth connection electrode is located on a side of the first electrode 134 close to the reset control line 220 in the pixel circuit; correspondingly, the connection electrode of the first electrode 134 is also located on a side of the first electrode 134 away from the reset control line 220 in the pixel circuit, and the connection electrode of the first electrode 134 is at least partially overlapped with the corresponding fourth connection electrode.

For example, as shown in FIG. 5, the display substrate 20 further includes a pixel defining layer 108 located on the first electrode of the light emitting element. An opening is formed in the pixel defining layer 108 to define an opening region 600 of the display substrate. The light emitting layer 136 is formed at least in the opening (light emitting layer 136 may also cover a portion of the pixel defining layer), and the second electrode 135 is formed on the light emitting layer 136 to form the light emitting device 120. For example, the second electrode 135 is a common electrode, and is disposed in the display substrate 20 with an entire surface. For example, the first electrode is an anode of the light emitting element, and the second electrode is a cathode of the light emitting element.

For example, as shown in FIGS. 4 and 5, for each pixel circuit, the orthogonal projections of the via hole 307 and the via hole 308 on the base substrate 101 are both located within the orthogonal projection of the third connection electrode 234 on the base substrate. For example, the via hole 307 and the via hole 308 are arranged side by side in the direction D1, and their center lines along the first direction D1 substantially coincide with each other. In a direction parallel to a surface of the base substrate 101, the via hole 308 is farther away from the body portion 141 of the first electrode 134 than the via hole 307, i.e., the opening region 600 of the sub-pixel (for example, the area of the first electrode 134 is greater than the area of the corresponding opening region 600, and the opening region 600 is located at a substantially middle region of the first electrode 134), that is, the orthographic projection of the via hole 308 on the base substrate 101 is farther away from the orthographic projection of the opening region 600 on the base substrate than the orthographic projection of the via hole 307 on the base substrate 101. This is because the insulating layer (for example, a second planarization layer) where the via 308 is located is closer to the body portion 142 of the first electrode 134 than the insulating layer (for example, the first planarization layer) where the via 307 is located in the direction perpendicular to the base substrate 101, and therefore, the influence of the via hole 308 on the flatness of the first electrode 134 is greater, and the influence of the via hole on the flatness of the light emitting layer 136 in the opening region may be reduced by disposing the via hole 308 away from the opening region or farther from the body portion of the first electrode 134 (on the surface parallel to the base substrate), and the performance of the light emitting element may be improved.

For example, in a row of repetitive units, the via holes 307 and 308 in the pixel circuit of the first sub-pixel 100a and the third sub-pixel 100c are both located on a side of the corresponding first electrode 134 away from the reset control line 220 in the pixel circuit, and for the second sub-pixel 100b and the fourth sub-pixel 100d, the corresponding fourth connection electrodes are located on a side of the first electrode 134 close to the reset control line 220 in the pixel circuit, that is, in a row of repetitive units, the via holes 307 and 308 in the pixel circuits of each sub-pixel are both located at a position between the row of the first sub-pixel 100a and the third sub-pixel 100c and the row of the second sub-pixel 100b and the fourth sub-pixel 100d.

For example, in one repetitive unit, the shapes of the fourth connection electrodes in the pixel circuits of the first sub-pixel 100a, the third sub-pixel 100c, the second sub-pixel 100b and the fourth sub-pixel 100d are substantially the same, the fourth connecting electrodes arranged substantially on the same straight line parallel to the direction D2. For example, the via holes 307 and 308 in the projection of the fourth connection electrode are not overlapped or not overlapped completely, so as to avoid poor connection, disconnection or unevenness at the position where the via hole is located due to stacked via holes in the vertical substrate direction. For example, the via holes 307 of the first sub-pixel 100a and the third sub-pixel 100c are substantially aligned with the via holes 308 of the second sub-pixel 100b and the fourth sub-pixel 100d, and the via holes 308 of the first sub-pixel 100a and the third sub-pixel 100c are substantially aligned with the via holes 307 of the second sub-pixel 100b and the fourth sub-pixel 100d.

For example, as shown in FIG. 5, orthographic projections of the opening region 600 and the via hole 308 on the base substrate 101 are not overlapped. For example, orthographic projections of the opening region 600 and the fourth connection electrode 234 on the base substrate 101 are not overlapped. This contributes to improvement in the flatness of the light emitting layer 136, and thus to improvement in light emitting efficiency.

For example, the base substrate 101 may be a rigid substrate, such as a glass substrate, a silicon substrate, or the like, or may be formed of a flexible material having excellent heat resistance and durability, such as Polyimide (PI), Polycarbonate (PC), polyethylene terephthalate (PET), polyethylene, polyacrylate, polyarylate, polyetherimide, polyethersulfone, polyethylene terephthalate (PET), Polyethylene (PE), polypropylene (PP), Polysulfone (PSF), Polymethylmethacrylate (PMMA), Triacetylcellulose (TAC), cycloolefin polymer (COP), and cycloolefin copolymer (COC), or the like.

For example, the material of the semiconductor layer 102 includes, but not limited to, silicon-based materials (amorphous silicon a-Si, polysilicon p-Si, etc.), metal oxide semiconductors (IGZO, ZnO, AZO, IZTO, etc.), and organic materials (hexathiophene, polythiophene, etc.).

For example, the material of the first to fourth conductive layers may include gold (Au), silver (Ag), copper (Cu), aluminum (Al), molybdenum (Mo), magnesium (Mg), tungsten (W), and an alloy material formed by combining the above-mentioned metals; or a conductive metal oxide material, such as Indium Tin Oxide (ITO), Indium Zinc Oxide (IZO), zinc oxide (ZnO), zinc aluminum oxide (AZO), etc.

For example, the light emitting element 120 has a top emission structure, the first electrode 134 is reflective and the second electrode 135 is transmissive or semi-transmissive. For example, the first electrode 134 is made of a high work function material to serve as an anode, such as an ITO/Ag/ITO laminated structure; the second electrode 135 is made of a low work function material to serve as a cathode, such as a semi-transmissive metal or metal alloy material, such as an Ag/Mg alloy material.

For example, the first insulating layer 103, the second insulating layer 104, and the third insulating layer 105 are inorganic insulating layers, for example, oxide of silicon, nitride of silicon or oxynitride of silicon, such as silicon oxide, silicon nitride, silicon oxynitride, or an insulating material including a metal oxynitride, such as aluminum oxide, titanium nitride, or the like. For example, the fourth insulating layer 106, the fifth insulating layer 107 and the pixel defining layer 108 may be made of organic materials respectively, such as Polyimide (PI), acrylate, epoxy, polymethyl methacrylate (PMMA), or the like. For example, the fourth insulating layer 106 and the fifth insulating layer 107 are planarization layers.

As shown in FIG. 2, the pixel circuit of the first sub-pixel 100*a* is electrically connected to a first data line 12*a* to receive the data signal Vd, and the pixel circuit of the second sub-pixel 100*b* is electrically connected to a second data line 12*b* to receive the data signal Vd. For example, the second data line 12*b* is located between the pixel circuit of the first sub-pixel 100*a* and the pixel circuit of the second sub-pixel 100*b*.

As shown in FIG. 2, the first capacitor electrode Caa in the first sub-pixel 100*a* and the first capacitor electrode Cab in the second sub-pixel 100*b* are disposed at an interval, that is, the first capacitor electrodes Ca in the first sub-pixel 100*a* and the second sub-pixel 100*b* are disconnected from one another in the conductive layer where they are located. Such an arrangement may reduce the overlap between the adjacent first capacitor electrodes Ca connected to one another and other signal lines, thereby reducing the parasitic capacitance.

For example, the first capacitor electrode Ca in each sub-pixel 100 has substantially the same area and shape.

For example, the relative position of the first capacitor electrode Ca in the respective sub-pixel 100 is the same. For example, the first capacitor electrodes Ca in each row of the sub-pixels 100 are linearly arranged in the second direction D2.

For example, the first capacitor electrode Ca in each sub-pixel 100 has an island-shaped structure in the conductive layer where it is located, i.e., is not electrically connected to other structures in the conductive layer where the first capacitor electrode Ca is located.

Figure 6:
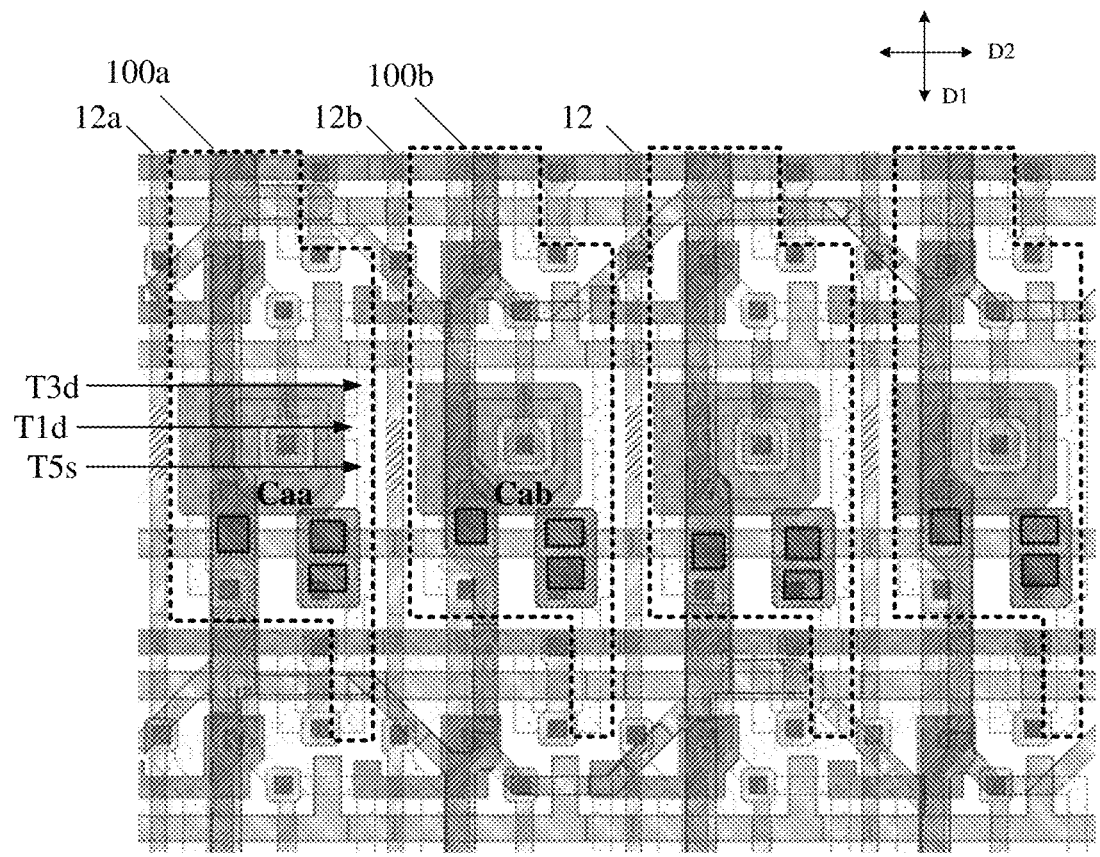
FIG. 6 is an eighth schematic diagram of a display substrate according to at least one embodiment of the present disclosure.

For example, as shown in FIG. 6, a junction where the second electrode T3*d* of the third transistor T3, the second electrode T1*d* of the first transistor T1, and the first electrode T1*s* of the fifth transistor T5 in the pixel circuit of the first sub-pixel 100*a* are connected and converges with one another exists between the adjacent first capacitor electrodes Ca, and disconnecting the first capacitor electrode Caa in the first sub-pixel 100*a* and the first capacitor electrode Cab in the second sub-pixel 100*b* can avoid the parasitic capacitance which is generated by the overlap between the first capacitor electrode Cab in the second sub-pixel 100*b* and the junction and would adversely affect a signal at the junction. For example, none of the orthographic projections of the second electrode T3*d* of the third transistor T3, the second electrode T1*d* of the first transistor T1 and the first electrode T1*s* of the fifth transistor T5 in the first sub-pixel 100*a* is overlapped with the first capacitor electrode Cab in the second sub-pixel 100*b* in the direction perpendicular to the base substrate 101.

For example, the range of the first capacitor electrode Ca in the sub-pixel 100 does not exceed the pixel region (the region where the pixel circuit is located) of the sub-pixel; that is, the first capacitor electrode Cab of the sub-pixel 100 does not extend into the pixel region of the adjacent sub-pixel to overlapped with the structure in the sub-pixel, and does not cause crosstalk.

For example, as shown in FIG. 6, the second data line 12*b* is further provided between the first capacitor electrodes Ca of the adjacent first sub-pixel 100*a* and second sub-pixel 100*b*, and neither of the projections of the first capacitor electrode Caa of the first sub-pixel 100*a* and the first capacitor electrode Cab of the second sub-pixel 100*b* on the base substrate is overlapped with a projection of the second data line 12*b* on the base substrate. Disconnecting the first capacitor electrode Caa in the first sub-pixel 100*a* and the first capacitor electrode Cab in the second sub-pixel 100*b* from each other may avoid harmful effect on the transmission of the data signal on the data line, for example, delay of the data signal, or the like, due to the generation of the parasitic capacitance caused by the overlap of the first capacitor electrode with the second data line 12*b*. On the other hand, since the data signal Vd is usually a high frequency signal and the first capacitor electrode Ca transmits the first power voltage VDD, the first power voltage is likely to change suddenly with the sudden change in the data signal Vd due to the existence of the parasitic capacitor, and the resistance-capacitance load between the first capacitor electrode Ca and the data line is too large, so that the first power voltage may not be recovered in a short time after the sudden change occurs. From the formula $Id=k/2*(Vd-VDD)^2$ of a saturation current in the first transistor T1 in the light emission phase, the fluctuation of the first power voltage VDD causes the fluctuation of the drive current, thereby causing an unstable luminance Therefore, disconnecting the first capacitor electrode Caa in the first sub-pixel 100*a* and the first capacitor electrode Cab in the second sub-pixel 100*b* from each other also contributes to improving the stability of light emission of the light emitting element.

The inventors of the present disclosure have found that the parasitic capacitance is generated between the data line 12 and the second capacitor electrode Cb of the storage capacitor Cst due to the overlap between the signal lines, which affects the stability of the storage capacitor Cst. Because the storage capacitor Cst is configured to store the data signal Vd and the information related to the threshold voltage of the drive sub-circuit, and is configured to use the stored information to control the drive sub-circuit 122 in the light emitting phase to allow the output of the drive sub-circuit 122 to be compensated, thus, the stability of the voltage (stored information) across the storage capacitor Cst will affect the stability of the gray scale, and thus the quality of the display screen.

Figure 7A:
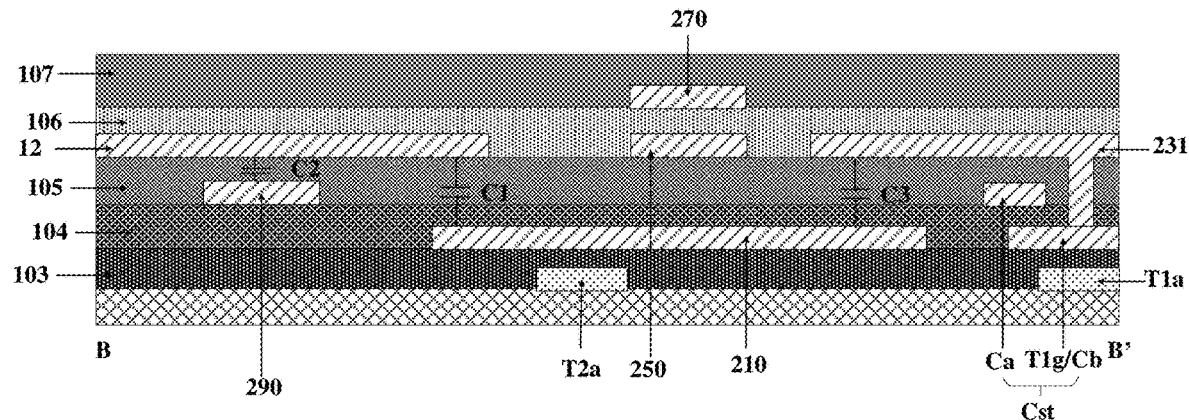
FIG. 7A is a sectional view of FIG. 2 along section line B-B'.

Some other embodiments of the present disclosure further provide a display substrate. As shown in FIGS. 2 and 7A, the first capacitor electrode Ca in at least one sub-pixel includes an extension portion 290 and the extension portion 290 is overlapped with the data line 12 connected to the one sub-pixel in the direction perpendicular to the base substrate 101 to provide a first capacitor C1.

Due to the presence of the first capacitor C1, the fluctuation of the data signal in the data line 12 is coupled to the first capacitor electrode Ca of the storage capacitor Cst through the first capacitor C1, while being coupled to the second capacitor electrode Cb of the storage capacitor Cst through the parasitic capacitor. This improves the stability of information stored in the storage capacitor Cst, and improves the display performance.

Figure 7B:
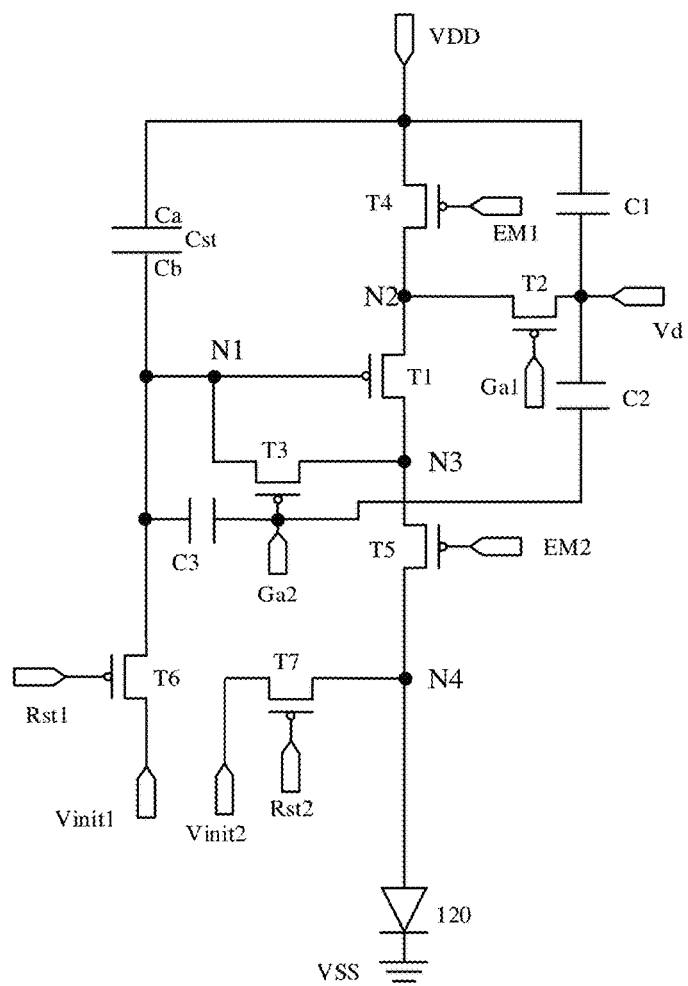
FIG. 7B is a third diagram of a pixel circuit in the display substrate according to at least one embodiment of the present disclosure.

FIG. 7A shows a sectional view of FIG. 2 along section line B-B', and FIG. 7B shows an equivalent circuit diagram of the pixel circuit. Referring to FIGS. 2 and 7A-7B, the data line 12 and the scan line 210 are overlapped in the direction perpendicular to the base substrate 101 to form a second capacitor C2 (an example of a first sub-capacitor in the embodiment of the present disclosure), and the first connection electrode 231 and the scan line 210 are overlapped in the direction perpendicular to the base substrate 101 to form a third capacitor C3 (an example of a second sub-capacitor in the embodiment of the present disclosure).

Because the first connection electrode 231 is electrically connected to the second capacitor electrode Cb of the storage capacitor Cst, the second capacitor C2 and the third capacitor C3 are connected in series between the data line 12 and the second capacitor electrode Cb of the storage capacitor Cst, and the fluctuation of the data signal in the data line 12 would be coupled to the second capacitor electrode Cb of the storage capacitor Cst through the second capacitor C2 and the third capacitor C3. Due to the presence of the first capacitor C1, fluctuations of the data signal in the data line 12 are also coupled to the first capacitor electrode Ca of the storage capacitor Cst through the first capacitor C1 at the same time. This improves the stability of information stored in the storage capacitor Cst, and improves the display performance.

For example, the capacitance of the first capacitor C1 is approximately equal to the capacitance of the second capacitor C2 and the third capacitor C3 connected in series, for example, equal to each other, i.e., $C1=(C2 \times C3)/(C2+C3)$.

For example, the extension portion 290 extends (protrudes) from the body portion of the first capacitor electrode Ca in the direction of the data line 12 which overlaps with the extension portion 290. For example, the first capacitor electrode Ca is shaped like a reversed Chinese character of "凸" toward the data line in the pixel circuit where first capacitor electrode Ca is located, i.e., the first capacitor electrode Ca is a substantially rectangular electrode block, and has a protrusion protruding toward the data line on the side close to the data line in the pixel circuit, and is located at the substantially middle of the side, and a via hole is present inside the first capacitor electrode Ca.

For example, in this case, the first capacitor electrode Ca still does not exceed the pixel region where the sub-pixel is located, that is, the first capacitor electrode Cab of the pixel circuit does not extend into the pixel region of the adjacent sub-pixel, is not overlapped with the structure in the adjacent sub-pixel, and does not cause crosstalk.

Figure 8:
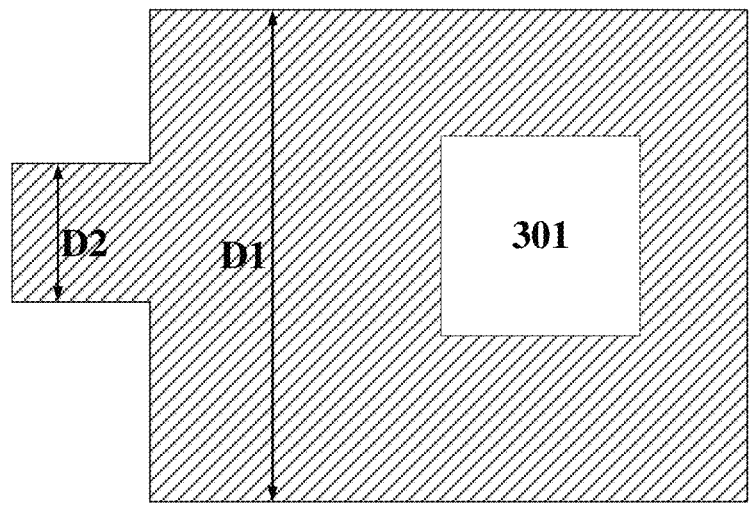
FIG. 8 is a schematic diagram of a first capacitor electrode according to at least one embodiment of the present disclosure.

FIG. 8 shows a schematic diagram of the first capacitor electrode Ca. As shown in FIG. 8, for example, the ratio of the area of the extension portion 290 to the area of the first capacitor electrode Ca ranges from 1/10 to 1/3, such as 1/5.

For example, in the first direction D1, the ratio of the maximum size D2 of the extension portion 290 to the maximum size D1 of the first capacitor electrode is in the range of 1/4-1/2, for example 1/3.

At least one embodiment of the present disclosure further provides a display panel, which includes any one of the above-mentioned display substrates 20. It should be noted that the above-mentioned display substrate 20 according to at least one embodiment of the present disclosure may include the light emitting element 120, or may not include the light emitting element 120; that is, the light emitting element 120 may be formed in a panel factory after the display substrate 20 is completed. In the case where the display substrate 20 itself does not include the light emitting element 120, the display panel according to the embodiment of the present disclosure further includes the light emitting element 120 in addition to the display substrate 20.

Figure 9:
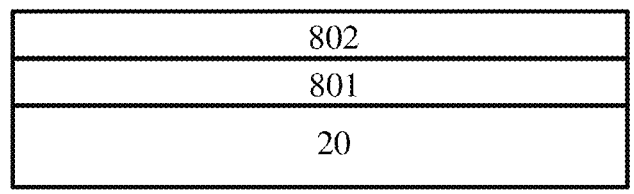
FIG. 9 is a schematic diagram of a display panel according to at least one embodiment of the present disclosure.

For example, the display panel is an OLED display panel, and correspondingly, the display substrate 20 included therein is an OLED display substrate. As shown in FIG. 9, for example, the display panel 30 further includes an encapsulation layer 801 and a cover plate 802 disposed on the display substrate 20, and the encapsulation layer 801 is configured to seal the light emitting element on the display substrate 10 to prevent damages to the light emitting element and the drive circuit due to penetration of external moisture and oxygen. For example, the encapsulation layer 801 includes an organic thin film or a structure in which an organic thin film and an inorganic thin film are alternately stacked. For example, a water absorption layer (not shown) may be further disposed between the encapsulation layer 801 and the display substrate 20, configured to absorb water vapor or sol remaining in the light emitting element during the previous manufacturing process. The cover plate 802 is, for example, a glass cover plate. For example, the cover plate 802 and the encapsulation layer 801 may be integrated with each other.

Figure 10:
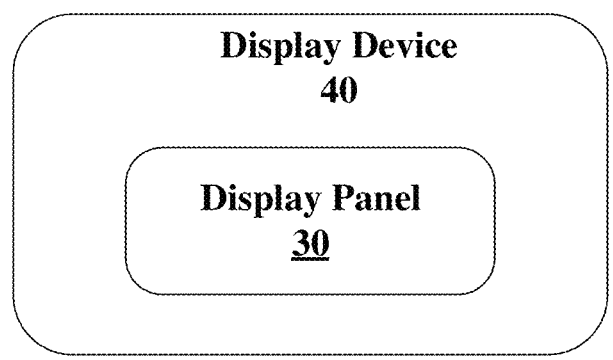
FIG. 10 is a schematic diagram of a display device according to at least one embodiment of the present disclosure.

At least one embodiment of the present disclosure further provides a display device 40. As shown in FIG. 10, the display device 40 includes any one of the above-mentioned display substrate 20 or display panel 30, and the display device in this embodiment may be any product or component with a display function, such as a display, an OLED panel, an OLED television, electronic paper, a mobile phone, a tablet computer, a notebook computer, a digital photo frame, a navigator or the like.

The embodiment of the present disclosure further provides a manufacturing method of the above-mentioned display substrate 20. The method for manufacturing a display substrate and its structure according to an embodiment of the present disclosure will be exemplarily described below with reference to FIGS. 2, 3A to 3E, 4 and 5, but the embodiment of the present disclosure is not limited thereto.

In some examples, the manufacturing method includes the following steps S61-S70.

Step S61: forming a semiconductor material layer on a base substrate and performing a patterning process on a semiconductor material layer, so as to form a semiconductor layer 102 as shown in FIG. 3A, the semiconductor layer 102 including active layers T1a-T7a and doped region patterns (i.e., source and drain regions corresponding to first to seventh transistors T1-T7) of the first to seventh transistors T1-T7 in each pixel region, and active layer patterns and the doped region patterns of the respective transistors in the same pixel region being integrally disposed.

It should be noted that the active layer may include an integrally formed low-temperature polysilicon layer, in which the source region and the drain region may be conducted, such as doped or the like, to realize the electrical connection of each structure. That is, an active semiconductor layer of each transistor of each sub-pixel is an overall pattern formed of p-silicon, and each transistor in the same pixel region includes the doped region pattern (i.e., the source region and the drain region) and the active layer pattern, the active layers of different transistors being separated by a doped structure.

Step S62: forming a first insulating layer 103 (which may be, for example, a transparent layer), such as a gate electrode insulating layer, on the semiconductor layer 102, and forming a plurality of first insulating layer via holes on the first insulating layer for connection with a pattern of a third conductive layer 203 formed subsequently. The corresponding first insulating layer via holes are formed in the first insulating layer, for example, corresponding to the positions of the source and drain regions in the semiconductor layer respectively, i.e., the first insulating layer via holes are overlapped with the source and drain regions in the semiconductor layer respectively, for the source and drain regions to be connected with the data line 12, the first power line 250, the first connection electrode 231, the second connection electrode 232, and the third connection electrode 233, etc., in the third conductive layer, for example, via holes 402, 405, 303, 305, etc., penetrating through the first insulating layer.

Step S63: forming a first conducting material layer on the first insulating layer and performing a patterning process on the first conducting material layer to form the first conductive layer 201 as shown in FIG. 3A, that is, the scan line 210, the reset control line 220, and the light emission control line 230, which are insulated from one another and extend in the second direction. For example, for one row of pixel circuits, the reset control line 220, the scan line 210, and the light emission control line 230, which are correspondingly connected with one another, are arranged in the first direction D1 successively.

For example, the first conductive layer 201 further includes gate electrodes T1g-T7g of the first to seventh transistors T1-T7. For example, the gate electrode T6g of the sixth transistor T6 is integrated with the reset control line 220, that is, a portion of the reset control line 220 serves as the gate electrode T6g of the sixth transistor T6; the gate electrode T2g of the second transistor T2 is integrated with the scan line 210, that is, a portion of the scan line 210 serves as the gate electrode T2g of the second transistor T2; the gate electrode T4g of the fourth transistor T4 and the gate electrode T5g of the fifth transistor T5 are both integrated with the light emission control line 230, that is, a portion of the light emission control line 230 serves as the gate electrode T4g of the fourth transistor T4 and the gate electrode T5g of the fifth transistor T5; the gate electrode T7g of the seventh transistor T7 is integrated with the reset control line 220 corresponding to the next row of pixel circuits. For example, the sixth transistor T6 and the third transistor T3 both have dual gate electrode structures, two gate electrodes T6g of the sixth transistor T6 are both part of the reset control line 220, one gate electrode of the third transistor T3 is part of the scan line 210, and the other gate electrode of the third transistor T3 is portion which is integrally connected with the scan line 210 and protrudes toward the reset control line 220 from the scan line 210.

For example, the portions of the semiconductor layer 102 overlapping with the first conductive layer 201 in the direction perpendicular to the base substrate define active layers (channel regions) T1a to T7a of the first to seventh transistors T1 to T7.

For example, in the direction D1, the gate electrode of the second transistor (e.g., data writing transistor) T2, the gate electrode of the third transistor (e.g., threshold compensation transistor) T3, the gate electrode of the sixth transistor (e.g., first reset transistor) T6, and the gate electrode of the seventh transistor (e.g., second reset transistor) T7 are all located on a first side of the gate electrode of the first transistor (e.g., drive transistor) T1, and the gate electrode of the fourth transistor (e.g., first light emission control transistor) T4 and the gate electrode of the fifth transistor (e.g., second light emission control transistor) T5 are all located on a second side of the gate electrode of the first transistor T1. In a plane parallel to the base substrate, the first side of the gate electrode of the first transistor T1 of the same pixel region may be a side of the gate electrode T1g of the first transistor T1 close to the scan line 230, and a second side of the gate electrode of the first transistor T1 may be a side of the gate electrode of the first transistor T1 away from the scan line 230.

For example, in the second direction D2, the gate electrode of the second transistor T2 and the gate electrode of the fourth transistor T4 are both located on a third side of the gate electrode of the first transistor T1, and the first gate electrode (gate electrode integral with the scan line 210) of the third transistor T3, the gate electrode of the fifth transistor T5 and the gate electrode of the seventh transistor T7 are all located on a fourth side of the gate electrode of the first transistor T1. For example, the third and fourth sides of the gate electrode of the first transistor T1 of the same pixel region are opposite sides of the gate electrode of the first transistor T1 in the D2 direction. For example, the third side of the gate electrode of the first transistor T1 of the same pixel region may be a left side of the gate electrode of the first transistor T1, and the fourth side of the gate electrode of the first transistor T1 may be a right side of the gate electrode of the first transistor T1. The left and right sides are, for example, in the same pixel region, the data line 12 is on the left side of the first power line 250, and the first power line 250 is on the right side of the data line.

Step S64: as shown in FIG. 3A, conducting (for example, doping) the semiconductor layer 102 by using the first conductive layer 201 as a mask through a self-alignment process, so that the portion of the semiconductor layer 102 not covered by the first conductive layer 201 is conducted, thereby conducting portions of the semiconductor layer 102 on both sides of the active layer of each transistor to form the source regions and drain regions of the first to seventh transistors T1-T7, that is, first electrodes (T1s-T7s) and second electrodes (T1d-T7d) of the first to seventh transistors T1-T7 respectively.

Step S65: forming a second insulating layer 104 (which may be, for example, a transparent layer), which may be, for example, a second gate electrode insulating layer, on the first conductive layer 201, and forming at least a second insulating layer via hole corresponding to the first insulating layer via hole on the second insulating layer. For example, the via hole at least penetrating through the first insulating layer and the second insulating layer correspondingly includes at least the via holes 402, 405, 303, 305, or the like.

Step S66: forming a second conducting material layer on the second insulating layer 104 and on the second insulating layer, and patterning the second conducting material layer to form the second conductive layer 202 as shown in FIG. 3B, that is, to form the shielding electrode 221, the first capacitor electrode Ca, and the reset voltage line 240 extending in the first direction, which are insulated from one another.

For example, the shielding electrode 221 is overlapped with the first electrode T2s of the second transistor T2 in the direction perpendicular to the base substrate 101, so that a signal in the first electrode T2s of the second transistor T2 may be protected against other signals.

For example, the first capacitor electrode Ca is at least partially overlapped with the gate electrode T1g of the first transistor T1 in the direction perpendicular to the base substrate 101. The patterning process also forms the via hole 301 in the first capacitor electrode Ca, the via hole 301 exposing at least a portion of the gate electrode T1g of the first transistor T1.

Step S67: forming a third insulating layer 105 on the second conductive layer 202. The third insulating layer may be, for example, an interlayer insulating layer. A via hole for connecting with the third conductive layer formed subsequently is formed in the third insulating layer. At least a portion of the via holes correspond in location to the first and second insulating layer via holes and extend through the first, second and third insulating layers, e.g., the via holes 402, 405, 303, 305.

Step S68: forming a third conducting material layer on the third insulating layer 105, and performing a patterning process on the third conducting material layer to form the third conductive layer 203 as shown in FIG. 3C, that is, to form the data line 12, the first power line 250, the first connection electrode 231, the second connection electrode 232, and the third connection electrode 233, which are insulated from one another. The data line 12 and the first power line 250 extend in the first direction D1.

For example, as shown in FIG. 3C, the data line 12 is overlapped with the first electrode T2s of the second transistor T2 in the direction perpendicular to the base substrate 101 and is electrically connected to the first electrode T2s of the second transistor T2 through the via hole 305, the via hole 305 penetrating through the first insulating layer 103, the second insulating layer 104, and the third insulating layer 105, for example.

For example, as shown in FIGS. 3C and 5, the first power line 250 is overlapped with the shielding electrode 221 in the direction perpendicular to the base substrate 101 and is electrically connected to the shielding electrode 221 through the via hole 304, for example, the via hole 304 penetrating through the third insulating layer 105.

For example, as shown in FIG. 3C, the first power line 250 is electrically connected to the first capacitor electrode Ca in one corresponding column of sub-pixels through the via hole 302, and is electrically connected to the first electrode T4s of the fourth transistor T4 through the via hole 303. For example, the via hole 302 penetrates through the third insulating layer 105, and the via hole 303 penetrates through the first insulating layer 103, the second insulating layer 104, and the third insulating layer 105.

For example, as shown in FIGS. 3C and 5, one terminal of the first connection electrode 231 is electrically connected to the gate electrode T1g of the first transistor T1, i.e., the second capacitor electrode Cb, through the via hole 301 in the first capacitor electrode Ca and the via hole 401 in the insulating layer, and the other terminal is electrically connected to the first electrode of the third transistor T3 through the via hole 402, thereby electrically connecting the second capacitor electrode Cb to the first electrode T3s of the third transistor T3. For example, the via hole 401 penetrates through the second insulating layer 104 and the third insulating layer 105, and the via hole 402 penetrates through the first insulating layer 103, the second insulating layer 104, and the third insulating layer 105.

For example, as shown in FIG. 3C, one terminal of the second connection electrode 232 is electrically connected to the reset voltage line through the via hole 403, and the other terminal is electrically connected to the sixth transistor T6 through the via hole 404, so that the first electrode T6s of the sixth transistor T6 may receive the first reset voltage Vinit1 from the reset voltage line 240. For example, the via hole 403 penetrates through the third insulating layer 105, and the via hole 404 penetrates through the first insulating layer 103, the second insulating layer 104, and the third insulating layer 105.

For example, as shown in FIGS. 3C and 5, the third connection electrode 233 is electrically connected to the second electrode T5d of the fifth transistor T5 through the via hole 405, and serves to electrically connect the second electrode T5d of the fifth transistor T5 to the first electrode 134 of the light emitting element, and for example, the via hole 405 penetrates through the first insulating layer 103, the second insulating layer 104, and the third insulating layer 105.

Step S69: forming a fourth insulating layer 106 on the third conductive layer 203, and forming a via hole in the third insulating layer for connection with the fourth conductive layer formed subsequently. In some embodiments, for example, the fourth insulating layer 106 includes a first planarization layer. In some other embodiments, for example, the fourth insulating layer 106 includes a passivation layer and a first planarization layer, and the via hole formed in the fourth insulating layer is required to penetrate through both the passivation layer and the first planarization layer. For example, the first planarization layer is located on a side of the passivation layer away from the third conductive layer.

Step S70: forming a fourth conducting material layer on the fourth insulating layer 106, and performing a patterning process on the fourth conducting material layer to form the fourth conductive layer 204 as shown in FIG. 3D, that is, to form the second power line 260, the third power line 270, and the fourth connection electrode 234, the second power line 260 and the third power line 270 being connected to each other and insulated from the fourth connection electrode 234.

For example, as shown in FIG. 3D, the plurality of third power lines 270 extend in the first direction D1 and are electrically connected to the plurality of first power lines 250 through the via holes 306 in one-to-one correspondence respectively. For example, each of the third power lines 270 is overlapped with the corresponding first power line 250 in the direction perpendicular to the base substrate 101. For example, the via hole 306 penetrates through the fourth insulating layer 106.

For example, as shown in FIG. 3D, the fourth connection electrode 234 is overlapped with the third connection electrode 233 in the direction perpendicular to the base substrate 101, and the third connection electrode 234 is electrically connected to the third connection electrode 233 through the via hole 307 penetrating through the fourth insulating layer 106.

For example, referring to FIGS. 4 and 5, the manufacturing method of a display substrate may further include forming a fifth insulating layer 107 on the fourth conductive layer 204, and forming a via hole in the fifth insulating layer 107 for connecting with the fifth conductive layer formed subsequently. For example, the fifth insulating layer 107 may be a second planarization layer. The fifth insulating layer via hole is used for connecting the drain of the first transistor and the first electrode of the light emitting device, and may or may not be overlapped with the second electrode of the first transistor, and a connection line may be additionally disposed in the third conductive layer without overlap, depending on the position and shape of the sub-pixel arrangement structure, such as the first electrode.

For example, the manufacturing method of the display substrate may further include forming a fifth conducting material layer on the fifth insulating layer 107, and performing a patterning process on the fifth conducting material layer to form the fifth conductive layer 205, that is, forming a plurality of first electrodes 134 for forming light emitting elements, which are insulated from one another.

For example, each of the first electrodes 134 includes a body portion 141 and a connection portion 142, the body portion 141 is mainly used for driving the light emitting layer to emit light, and the connection portion 142 is mainly used for electrically connecting with the pixel circuit.

For example, as shown in FIG. 5, the connection portion 142 is electrically connected to the fourth connection electrode 234 through the via hole 308 in the fifth insulating layer 107. For example, in the direction parallel to the surface of the base substrate 101, the via hole 308 is farther away from the body portion 141 of the first electrode 134 than the via hole 307, i.e., the opening region 600 of the sub-pixel. That is, the orthographic projection of the via hole 308 on the base substrate 101 is farther away from the orthographic projection of the opening region 600 on the base substrate than the orthographic projection of the via hole 307 on the base substrate 101.

For example, as shown in FIG. 5, the manufacturing method of the display substrate may further include forming a pixel defining layer 108 on the fifth conductive layer 205 successively, forming an opening region 600 in the pixel defining layer 108 corresponding to the body portion 141 of each first electrode 134, then forming a light emitting layer 136 at least in the opening region 600, and forming a second electrode 135 on the light emitting layer.

For example, the material of the semiconductor material layer includes, but not limited to, silicon-based materials (amorphous silicon a-Si, polysilicon p-Si, etc.), metal oxide semiconductors (IGZO, ZnO, AZO, IZTO, etc.), and organic materials (hexathiophene, polythiophene, etc.).

For example, the material of the above-mentioned first, second, third, fourth, and fifth conducting material layers and the second electrode may include gold (Au), silver (Ag), copper (Cu), aluminum (Al), molybdenum (Mo), magnesium (Mg), tungsten (W), and an alloy material formed by combining the above metals; or a transparent conductive metal oxide material such as Indium Tin Oxide (ITO), Indium Zinc Oxide (IZO), zinc oxide (ZnO), zinc aluminum oxide (AZO), etc.

For example, the first insulating layer 103, the second insulating layer 104, the third insulating layer 105, the fourth insulating layer 106, and the fifth insulating layer 107 are inorganic insulating layers, for example, oxide of silicon, nitride of silicon or oxynitride of silicon, such as silicon oxide, silicon nitride, silicon oxynitride, or an insulating material including a metal oxynitride, such as aluminum oxide, titanium nitride, or the like. For example, parts of the insulating layers may also be made of organic materials, for example, the first and second planarization layers, such as Polyimide (PI), acrylate, epoxy, polymethyl methacrylate (PMMA), or the like. The embodiments of the present disclosure are not limited thereto. For example, the fourth and fifth insulating layers 106 and 107 may include the planarization layer respectively.

For example, the above-mentioned patterning process may include a conventional photolithography process, including, for example, coating of a photoresist, exposing, developing, baking, etching, or the like.

What are described above is related to the illustrative embodiments of the disclosure only and not limitative to the scope of the disclosure; the scopes of the disclosure are defined by the accompanying claims.

What is claimed is:

1. A display substrate, comprising:
   a base substrate, and
   a plurality of sub-pixels on the base substrate,
   wherein each of the plurality of sub-pixels comprises a pixel circuit for driving a light emitting element to emit light; pixel circuits of the plurality of sub-pixels are distributed in a plurality of columns in a first direction and a plurality of rows in a second direction;
   the pixel circuit comprises a drive sub-circuit, a data write sub-circuit, a compensation sub-circuit and a storage sub-circuit;
   the drive sub-circuit comprises a control terminal, a first terminal and a second terminal, and is configured to be coupled with the light emitting element and control a drive current flowing through the light emitting element;
   the data write sub-circuit comprises a control terminal, a first terminal and a second terminal, the control terminal of the data write sub-circuit is configured to receive a first scanning signal, the first terminal of the data write sub-circuit is configured to receive a data signal, the second terminal of the data write sub-circuit is electrically connected with the drive sub-circuit, and the data write sub-circuit is configured to write the data signal into the first terminal of the drive sub-circuit in response to the first scanning signal;
   the compensation sub-circuit comprises a control terminal, a first terminal and a second terminal, the control terminal of the compensation sub-circuit is configured to receive a second scanning signal, the first terminal and the second terminal of the compensation sub-circuit are electrically connected with the control terminal and the second terminal of the drive sub-circuit respectively, and the compensation sub-circuit is configured to perform threshold value compensation on the drive sub-circuit in response to the second scanning signal;
   the storage sub-circuit is electrically connected with the control terminal of the drive sub-circuit and a first voltage terminal and is configured to store the data signal; the storage sub-circuit comprises a storage capacitor, a first capacitor electrode of the storage capacitor is coupled with the first voltage terminal, and a second capacitor electrode is coupled with the control terminal of the drive sub-circuit;
   the plurality of sub-pixels comprise a first sub-pixel, the display substrate further comprises a first data line connected with the first sub-pixel, the first data line is extended in the first direction and is connected with the first terminal of the data write sub-circuit of the first sub-pixel to provide the data signal;
   the plurality of sub-pixels further comprises a second sub-pixel directly adjacent to the first sub-pixel in the second direction;
   the first capacitor electrode in the first sub-pixel and the first capacitor electrode in the second sub-pixel are in a same layer and are spaced apart from each other;
   the first capacitor electrode in the first sub-pixel comprises a main body portion and an extension portion, and the extension portion protrudes from the main body portion;
   in the first direction, a maximum size of the extension portion is less than a maximum size of the main body portion of the first capacitor electrode; and the extension portion of the first capacitor electrode in the first sub-pixel is overlapped with the first data line in a direction perpendicular to the base substrate to provide a first capacitor.

2. The display substrate according to claim 1, wherein the main body portion of the first capacitor electrode in the first sub-pixel is in a block shape and has an opening therein.

3. The display substrate according to claim 1, wherein the first data line is between the pixel circuit of the first sub-pixel and the pixel circuit of the second sub-pixel.

4. The display substrate according to claim 1, wherein the drive sub-circuit in the second sub-pixel comprises a first transistor, the first transistor comprises a gate electrode, a first electrode and a second electrode, and the second electrode functions as the second terminal of the drive sub-circuit;
the second electrode of the first transistor is not overlapped with the first capacitor electrode in the first sub-pixel in the direction perpendicular to the base substrate.

5. The display substrate according to claim 1, wherein a ratio of an area of the extension portion to an area of the first capacitor electrode is in a range of 1/10-1/3.

6. The display substrate according to claim 1, wherein in the first direction, a ratio of the maximum size of the extension portion to the maximum size of the first capacitor electrode is in a range of 1/4-1/2.

7. The display substrate according to claim 1, wherein the first sub-pixel further comprises a second capacitor;
a first terminal and a second terminal of the second capacitor are respectively electrically connected with the first data line and the second capacitor electrode of the first sub-pixel.

8. The display substrate according to claim 1, further comprising a plurality of first power lines,
wherein the plurality of first power lines are extended in the first direction, are connected to the first voltage terminal, and are configured to provide a first power voltage for the plurality of sub-pixels.

9. The display substrate according to claim 8, wherein the plurality of first power lines are on a side of the first capacitor electrode away from the base substrate,
the display substrate further comprises an interlayer insulating layer between the first capacitor electrode and the plurality of first power lines,
two of the plurality of first power lines are respectively electrically connected with the first capacitor electrode in the first sub-pixel and the first capacitor electrode in the second sub-pixel through a first via hole in the interlayer insulating layer to provide the first power voltage.

10. The display substrate according to claim 8, further comprising a second power line, wherein the second power line is extended in the second direction and is electrically connected with the plurality of first power lines.

11. The display substrate according to claim 10, wherein none of opening regions of the plurality of sub-pixels is overlapped with the second power line in the direction perpendicular to the base substrate.

12. The display substrate according to claim 10, wherein each of the plurality of sub-pixels further comprises a second connection electrode and a third connection electrode,
wherein the second connection electrode and the plurality of first power lines are in a same layer and are insulated from one another, and the third connection electrode and the second power line are in a same layer and are insulated from each other,
the second connection electrode and the pixel circuit of each of the plurality of sub-pixels are electrically connected through a third via hole, the first connection electrode and the second connection electrode of each plurality of sub-pixels are electrically connected through a fourth via hole, and the third connection electrode is configured to be electrically connected with the light emitting element of each plurality of sub-pixels through a fifth via hole.

13. The display substrate according to claim 12, wherein neither of an orthographic projection of the fourth via hole on the base substrate and an orthographic projection of the fifth via hole on the base substrate is overlapped with an orthographic projection of an opening region of the sub-pixel to which the fourth via hole and the fifth via hole belong on the base substrate.

14. The display substrate according to claim 13, wherein the orthographic projection of the fourth via hole on the base substrate is closer to the orthographic projection of the opening region of the sub-pixel than the orthographic projection of the fifth via hole on the base substrate.

15. A display device, comprising the display substrate according to claim 1.

16. A display substrate, comprising:
a base substrate, and
a plurality of sub-pixels on the base substrate,
wherein each of the plurality of sub-pixels comprises a pixel circuit for driving a light emitting element to emit light; pixel circuits of the plurality of sub-pixels are distributed in a plurality of columns in a first direction and a plurality of rows in a second direction;
the pixel circuit comprises a drive sub-circuit, a data write sub-circuit, a compensation sub-circuit and a storage sub-circuit;
the drive sub-circuit comprises a control terminal, a first terminal and a second terminal, and is configured to be coupled with the light emitting element and control a drive current flowing through the light emitting element;
the data write sub-circuit comprises a control terminal, a first terminal and a second terminal, the control terminal of the data write sub-circuit is configured to receive a first scanning signal, the first terminal of the data write sub-circuit is configured to receive a data signal, the second terminal of the data write sub-circuit is electrically connected with the drive sub-circuit, and the data write sub-circuit is configured to write the data signal into the first terminal of the drive sub-circuit in response to the first scanning signal;
the compensation sub-circuit comprises a control terminal, a first terminal and a second terminal, the control terminal of the compensation sub-circuit is configured to receive a second scanning signal, the first terminal and the second terminal of the compensation sub-circuit are electrically connected with the control terminal and the second terminal of the drive sub-circuit respectively, and the compensation sub-circuit is configured to perform threshold value compensation on the drive sub-circuit in response to the second scanning signal;
the storage sub-circuit is electrically connected with the control terminal of the drive sub-circuit and a first voltage terminal and is configured to store the data signal; the storage sub-circuit comprises a storage capacitor, a first capacitor electrode of the storage capacitor is coupled with the first voltage terminal, and a second capacitor electrode is coupled with the control terminal of the drive sub-circuit;

the plurality of sub-pixels comprise a first sub-pixel, the display substrate further comprises a first data line connected with the first sub-pixel, the first data line is extended in the first direction and is connected with the first terminal of the data write sub-circuit of the first sub-pixel to provide the data signal;

the plurality of sub-pixels further comprises a second sub-pixel directly adjacent to the first sub-pixel in the second direction;

the first capacitor electrode in the first sub-pixel and the first capacitor electrode in the second sub-pixel are in a same layer and are spaced apart from each other; and the first capacitor electrode in the first sub-pixel is overlapped with the first data line in a direction perpendicular to the base substrate to provide a first capacitor;

the first sub-pixel further comprises a second capacitor;

a first terminal and a second terminal of the second capacitor are respectively electrically connected with the first data line and the second capacitor electrode of the first sub-pixel;

the second capacitor comprises a first sub-capacitor and a second sub-capacitor connected in series with each other;

the display substrate further comprises a first scan line extended in the second direction, the first scan line is connected with the control terminal of the compensation sub-circuit of the first sub-pixel to provide the second scanning signal, and the first scan line and the first data line are overlapped with each other in the direction perpendicular to the base substrate to form the first sub-capacitor; and the first sub-pixel further comprises a first connection electrode, the first connection electrode is connected with the second capacitor electrode and the second terminal of the compensation sub-circuit of the first sub-pixel respectively, and the first scan line and the first connection electrode are overlapped with each other in the direction perpendicular to the base substrate to form the second sub-capacitor.

17. The display substrate according to claim 16, wherein in the direction perpendicular to the base substrate, the first connection electrode is on a side of the first capacitor electrode away from the second capacitor electrode; and the first capacitor electrode comprises an opening, and the first connection electrode is electrically connected with the second capacitor electrode through the opening.

18. A display substrate, comprising:

a base substrate, and a plurality of sub-pixels on the base substrate, wherein each of the plurality of sub-pixels comprises a pixel circuit for driving a light emitting element to emit light; pixel circuits of the plurality of sub-pixels are distributed in a plurality of columns in a first direction and a plurality of rows in a second direction;

the pixel circuit comprises a drive sub-circuit, a data write sub-circuit, a compensation sub-circuit and a storage sub-circuit;

the drive sub-circuit comprises a control terminal, a first terminal and a second terminal, and is configured to be coupled with the light emitting element and control a drive current flowing through the light emitting element;

the data write sub-circuit comprises a control terminal, a first terminal and a second terminal, the control terminal of the data write sub-circuit is configured to receive a first scanning signal, the first terminal of the data write sub-circuit is configured to receive a data signal, the second terminal of the data write sub-circuit is electrically connected with the drive sub-circuit, and the data write sub-circuit is configured to write the data signal into the first terminal of the drive sub-circuit in response to the first scanning signal;

the compensation sub-circuit comprises a control terminal, a first terminal and a second terminal, the control terminal of the compensation sub-circuit is configured to receive a second scanning signal, the first terminal and the second terminal of the compensation sub-circuit are electrically connected with the control terminal and the second terminal of the drive sub-circuit respectively, and the compensation sub-circuit is configured to perform threshold value compensation on the drive sub-circuit in response to the second scanning signal;

the storage sub-circuit is electrically connected with the control terminal of the drive sub-circuit and a first voltage terminal and is configured to store the data signal; the storage sub-circuit comprises a storage capacitor, a first capacitor electrode of the storage capacitor is coupled with the first voltage terminal, and a second capacitor electrode is coupled with the control terminal of the drive sub-circuit;

the plurality of sub-pixels comprise a first sub-pixel, the display substrate further comprises a first data line connected with the first sub-pixel, the first data line is extended in the first direction and is connected with the first terminal of the data write sub-circuit of the first sub-pixel to provide the data signal;

the plurality of sub-pixels further comprises a second sub-pixel directly adjacent to the first sub-pixel in the second direction;

the first capacitor electrode in the first sub-pixel and the first capacitor electrode in the second sub-pixel are in a same layer and are spaced apart from each other; and the first capacitor electrode in the first sub-pixel is overlapped with the first data line in a direction perpendicular to the base substrate to provide a first capacitor;

the display substrate further comprises a plurality of first power lines, a second power line, and a plurality of third power lines;

the plurality of first power lines are extended in the first direction, are connected to the first voltage terminal, and are configured to provide a first power voltage for the plurality of sub-pixels;

the second power line is extended in the second direction and is electrically connected with the plurality of first power lines;

the plurality of third power lines are extended in the first direction, wherein the plurality of third power lines are electrically connected with the plurality of first power lines in one-to-one correspondence respectively, and each of the plurality of third power lines is at least partially overlapped with the corresponding first power line in the direction perpendicular to the base substrate.

19. The display substrate according to claim 18, wherein the plurality of third power lines and the plurality of second power lines are in a same layer and are of an integral structure.

20. The display substrate according to claim 18, wherein the plurality of third power lines are on a side of the plurality of first power lines away from the base substrate;

the display substrate further comprises a planarization layer between the plurality of third power lines and the plurality of first power lines, each of the plurality of third power line is electrically connected with the corresponding first power line through a second via hole in the planarization layer, so that the second power line is electrically connected with the plurality of first power lines.

* * * * *